United States Patent [19]

Beck et al.

[11] Patent Number: 4,937,827

[45] Date of Patent: Jun. 26, 1990

[54] CIRCUIT VERIFICATION ACCESSORY

[75] Inventors: Ronald R. Beck, Banks; Michael E. Stanbro, Tigard; Eric J. Thomsen, Aloha, all of Oreg.

[73] Assignee: Mentor Graphics Corporation, Beaverton, Oreg.

[21] Appl. No.: 385,934

[22] Filed: Jul. 25, 1989

Related U.S. Application Data

[60] Continuation of Ser. No. 148,993, Mar. 18, 1988, abandoned, which is a division of Ser. No. 70,598, Jul. 8, 1987, Pat. No. 4,744,084, which is a continuation of Ser. No. 832,838, Feb. 2, 1986, abandoned, which is a continuation-in-part of Ser. No. 707,497, Mar. 1, 1985, abandoned.

[51] Int. Cl.$^5$ .............................................. G06F 11/00
[52] U.S. Cl. .................................... 371/23; 371/16.1; 371/25.1; 364/578
[58] Field of Search ...................... 371/16.1, 16.2, 17, 371/18, 22.1, 23, 25.1, 27; 364/578, 488, 489, 490, 150, 149, 151, 200 MS File, 900 MS File; 324/73 R, 73 AT

[56] References Cited

U.S. PATENT DOCUMENTS

| | | |
|---|---|---|
| Re. 31,056 | 10/1982 | Chau et al. |
| 3,673,397 | 6/1972 | Schaefer |
| 3,715,573 | 2/1973 | Vogelsberg |
| 3,739,349 | 6/1973 | Burdette, Jr. et al. |
| 3,764,995 | 10/1973 | Helf, Jr. et al. |
| 3,832,535 | 8/1974 | De Vito |
| 3,872,441 | 3/1975 | Cailow |
| 3,932,843 | 1/1976 | Trelut et al. |
| 4,000,460 | 12/1976 | Kadakia et al. |
| 4,213,253 | 7/1980 | Gudelis et al. |
| 4,236,246 | 11/1980 | Skilling |
| 4,370,728 | 1/1983 | Coffron |
| 4,397,021 | 8/1985 | Lloyd et al. |
| 4,402,055 | 8/1983 | Lloyd et al. |
| 4,451,918 | 5/1984 | Gillette |
| 4,456,994 | 6/1984 | Segarra |
| 4,488,299 | 12/1984 | Fellhauer et al. |

(List continued on next page.)

FOREIGN PATENT DOCUMENTS

| | | |
|---|---|---|
| 2111493 | 9/1972 | Fed. Rep. of Germany . |
| 2832239 | 2/1979 | Fed. Rep. of Germany . |
| 2812396 | 9/1979 | Fed. Rep. of Germany . |
| 153929 | 2/1982 | German Democratic Rep. . |
| 204788 | 12/1983 | German Democratic Rep. . |
| 53-84642 | 7/1978 | Japan . |
| 54-111241 | 8/1979 | Japan . |
| 55-57955 | 4/1980 | Japan . |
| 56-29757 | 3/1981 | Japan . |
| 2131211 | 6/1984 | United Kingdom . |
| 2164768 | 3/1986 | United Kingdom . |
| 2173930 | 10/1986 | United Kingdom . |

OTHER PUBLICATIONS

Acken, John M., Delay Modeling in Logic Simulation, 1980 IEEE, pp. 945–947, 05/01/80.

(List continued on next page.)

*Primary Examiner*—Jerry Smith
*Assistant Examiner*—Robert W. Beausoliel
*Attorney, Agent, or Firm*—Klarquist, Sparkman, Campbell, Leigh & Whinston

[57] ABSTRACT

A hardware modeling system 10 simulates portions of electrical circuits 16, 18 utilizing actual hardware components in the simulation. Access to these hardware modeling elements 16, 18 is provided on a shared basis to plural workstations 14. Simulation vectors for plural users may be stored discontiguously in a first memory 26 and a single user's vectors are transferred to a second memory 28 for streaming to the elements 16, 18. An optional timing analyzer and memory circuit 34 periodically samples outputs from pins of the hardware modeling elements to provide timing information on the response of such elements. High impedance testing and bus contention detection is performed on the pins of the hardware modeling elements. Clocking signals applied to the hardware modeling elements are adjustable and may be set at extremely high frequencies. A special gating circuit 292 accesses each pin of the hardware modeling elements and incorporates one or more of the above features.

4 Claims, 21 Drawing Sheets

4,937,827

Page 2

U.S. PATENT DOCUMENTS

| | | |
|---|---|---|
| 4,495,642 | 1/1985 | Zellmer . |
| 4,517,661 | 5/1985 | Graf et al. . |
| 4,527,249 | 7/1985 | Van Brunt . |
| 4,604,718 | 8/1986 | Norman et al. . |
| 4,635,256 | 1/1987 | Herlein . |
| 4,644,487 | 2/1987 | Smith . |
| 4,654,851 | 3/1987 | Busby ................................ 371/23 X |
| 4,656,632 | 4/1987 | Jackson . |
| 4,725,971 | 2/1988 | Doshi ................................ 371/23 X |
| 4,744,084 | 5/1988 | Beck ....................................... 371/23 |

OTHER PUBLICATIONS

Albrow, Robert, 2-Head Auto-Test System Takes on Complex VLSI, Electronic Design, pp. 79–84, 03/05/81.

Anderson, D. W. et al, Trigger/Latch Technique for Hardware Simulation Programs, IBM Technical Disclosure Bulletin, vol. 24, No. 4, pp. 1866–1868, 09/01/81.

Anderson, Robert E. et al., Processor-Based Tester Goes on Site to Isolate Board Faults Automatically, Electronics, pp. 111–117, 05/11/78.

Anlauff, H. et al., PHPL-A New Computer Hardware Description Language for Modular Description of Logic and Timing, 1979, IEEE, pp. 124–130, 05/01/79.

Axtell, C. R., Reference Testing Techniques for LSI PCB's, 1979 IEEE Test Conference, pp. 358–359, 01/01/79.

Azema, P. et al, Petri Nets as a Common Tool for Design Verification and Hardware Simulation, Laboratoire d'Automatique, pp. 109–116.

Barney, CAE Systems Include Actual IC to Avoid Simulation Obstacle, Electronics, pp. 47–48, 03/08/84.

Barto, R., Szygenda, S. A., A Computer Architecture for Digital Logic Simulation, Electronic Engineering, pp. 35–66, 09/01/80.

Barto, R. L., Szygenda, S. A., Thompson, E. W., Architecture for a Hardware Simulator, 1980 IEEE, pp. 891–893, 01/01/80.

Benson, J. D., Testing Trends for the 1980s, Semiconductor International, pp. 55–58, 01/01/80.

Bissett, S., LSI Tester Gets Microprocessors to Generate Their Own Test Patterns, Electronics, pp. 141–145, 05/25/78.

Blum, A., Use of Independent Error Detection Systems for Field-Replaceable Units, IBM Technical Disclosure Bulletin, vol. 23, No. 4, pp. 1504–1505, 09/01/80.

Brandsma, J. R. et al., The Hardware Simulator: A Tool for Evaluating Computer Systems, IEEE Transactions on Computers, pp. 68–72, 01/01/77.

Brule, J. D. et al., Diagnosis of Equipment Failures, IRE Transactions on Reliability and Control, pp. 23–34, 04/01/60.

Buehler, M. G. et al, Role of Test Chips in Coordinating Logic and Circuit Design and Layout Aids for VLSI, Solid State Technology, pp. 68–74, 09/01/81.

Buehler, M. G. et al, Microelectronic Test Chips and Associated Parametric Testers: Present and Future, National Bureau of Standards and Signetics Corporation, pp. 859–867.

Campbell, J. et al, A New Software System for LSI Testing, Fairchild Systems Technology, pp. 131–134.

Carreno, J. A., Automated Test for a Processor, IBM Technical Disclosure Bulletin, vol. 14, No. 18, pp. 2970–2971, 03/01/72.

Chao, C. C., AC Test Pattern Generation for Sequential Logic, IBM Technical Disclosure Bulletin, pp. 2439–2441, 01/01/74.

Chen, Chung Ho, VLSI Design for Testability, 1979 IEEE Test Conference, pp. 306–309, 09/01/79.

Chrones, C., What's New in Analog Testers, Semiconductor International, pp. 59–70, 09/01/81.

Chrones, Chris, What is New in Memory Testing, Semiconductor International, pp. 67–76, 01/01/81.

Chrones, Chris, LSI Testing Trends, Electronic Packaging and Production, pp. 63–82, 04/01/80.

Crawford, J. D. et al., Unified Hardware Description Language for CAD Programs, 1979 IEEE, pp. 151–154, 05/01/79.

Daisy Systems, Corp., MegaLOGICIAN Physical Modeling Extension (PMX), Brochure, pp. 1–2.

Daisy Systems, Corp., PMX Physical Modeling Extension, Brochure, pp. 1–12.

Davidson, R. P., Some Straightforward Guidelines Help Improve Board Testability, EDN, pp. 127–129, 05/05/79.

Editors, Electronic Engineering, Product Focus: CAE/CAD, Electronic Engineering, pp. 60–73, 07/01/84.

Evangelisti, C. J., Goertzel, G., Ofek, H., Symbolic (List continued on next page.)

OTHER PUBLICATIONS

Simulator for Digital Hardware, IBM Technical Disclosure Bulletin, vol. 21, No. 4, pp. 1736–1739, 09/01/78.

Fee, W. G., Low-Cost LSI Test Solutions, Adar Associates, Inc., pp. 62–63.

Freeman, Physical Modeling Systems Let You Plug VLSI Chips Into Your Workstation's Logic, EDN, pp. 69–73, 11/15/84.

Freund, R. A., Koralek, R. W., A Technique for Testing LSI Closed Loop Networks, 1979 IEEE Test Conference, pp. 317–325, 01/01/79.

Funatsu, S. et al, Easily Testable Design of Large Digital Circuits, NEC Research & Development No. 54, pp. 49–55, 07/01/79.

Gillette, Garry C., Tester Takes on VLSI With 264-K Vectors Behind Its Pins, Electronics, pp. 122–127, 11/03/81.

Gindraux, L. et al, CAE Station's Simulators Tackle 1 Million Gates, Electronic Design, pp. 127–135, 11/10/83.

Grason, J., Design Aids and Hardware Testing of Microprocessor System Circuit Packs, Bell Telephone Laboratories, Inc., pp. 95–99.

Grundmann, J. W., Simulation of Bidirectional Transmission Gates, Missile Systems Group Hughes Aircraft Company, pp. 47–51.

Hellestrand, G. R., MODAL, A System for Digital Hardware Description and Simulation, 1979 IEEE, pp. 131–137, 05/01/79.

Henckels, L. P. et al., Evaluation Criteria for Test Program Generation Systems, 1978 IEEE, pp. 76–78, 02/01/78.

Henckels, Lutz et al., Microprocessor Circuit Board Simulation and Test, Instrumentation Engineering, pp. 17–21.

HHB Systems, CATS Dynamic Hardware Modeler, Brochure, pp. 1–4.

Hirabayashi, K., Watanabe, J., MATIS-Macromodel Timing Simulator for Large Scale Integrated MOS Circuits, 3rd USA-Japan Computer Conference, pp. 457–461, 10/10/78.

Hsu, Frank C., A Comparison Study of the Techniques for Deriving Component Diagnosis for Manufacturing Testing of Cards and Boards, IBM Corporation Systems Products Division, pp. 192–195.

Hughes, John et al., In-Circuit Testing of LSI Components, Electronic Packaging and Production, pp. 79–88, 02/01/81.

Hughes, John et al., In-Circuit Testing of LSI Components, Fairchild Test Systems Group, pp. 263–270.

Huston, R. E., 8086 16-Bit Microprocessor Sentry Program Description, Fairchild, pp. 1–2, 07/24/79.

Huston, R. E., Truth Table Development (Advanced User's Course Materials), Fairchild, pp. 300, 01/01/79.

Huston, R. E., Structure and Method for Testing Microprocessor Central Processing Units, U.S. Patent Application Ser. No. 518,134, pp. 1–40, 10/25/74.

Huston, R. E., Excerpts From Manual, Fairchild, pp. 11.59–11.97.

Huston, R. E., 8086 16-Bit Microprocessor Sentry Functional Pattern Generator Description, Fairchild, pp. 1–300, 07/11/79.

Hutcheson, J. D., Semiconductor Testing Requirements in the 1980s, Solid State Technology, pp. 133–137, 08/01/80.

Ichimiya, Yoshichika et al., Effective Test Pattern Generation for High Speed Logic LSI Testing, 1979 IEEE Test Conference, pp. 377–381, 01/01/79.

IMS (Integrated Measurement Systems, Inc), Logic Master HS-High Speed Verification, Brochure, pp. 1–10.

Kaga, K., Circuit Design for Testability of LSI and VLSI Based Circuits and Systems, Decision Data Computer Corporation, pp. 601–606.

Knowlton, D., Is There a Future for Distributed Systems?, Advanced Micro Devices, pp. 136–137.

Koch, B., Nett, M., CAD fur IC, data report 19, pp. 20–23, 01/01/84.

Kocher, Detlef, Was Macht den In-Circuit-Tes wirtschaftlich?, selektronikprasise-Nr. 1, pp. 70–77, 01/01/81.

Kormos, I. et al., uP Controlled Programmable DC Measuring System, Hiki 1348 Budapest 62 POB 348 Hungary, pp. 819–835.

Kovijanic, P. G., Testability Analysis, Sperry Research Center, pp. 310–316, 01/01/79.

Liaw, Chi-Chang et al., Test-Experiments for Detection and Location of Intermittent Faults in Sequential (List continued on next page.)

OTHER PUBLICATIONS

Circuits, IEEE Transactions on Computers, pp. 989–995, 12/01/81.

Lindmaier, Klaus, Prufmethoden bei Hochintegrierten Schaltungen am Beispiel Einer Familie Von Fernbedienungsempfangern, Elektronische Bauelemente, Heilbronn, pp. 91–94.

Lindwedel, J. H., Low–Cost LSI Device Failure Isolation Equipment, Autonetics Group, pp. 92–98.

Lineback, J. R., Logic Simulation Speeded with New Special Hardware, Electronics Review, pp. 45–46, 06/16/82.

Markstein, Howard W., Incoming Inspection of Analog/Digital Devices, Electronic Packaging and Production, pp. 63–75.

Marshall, J., Un Emulateur Universal et un Emulateur Memoire Laissent Les Concepteurs Libres de Leur Choix, Electronique Industrielle, No. 50, pp. 43–46, 4/1/83.

Maruyama, H. et al, A 100 MHz Test Station for High Speed LSI Testing, 1979 IEEE Test Conference, pp. 369–376, 01/01/79.

McWilliams et al, Twin Processors Speed CAE Workstation's Complex Simulations, Electronic Design, pp. 1–7, 05/31/84.

Middleton, T., Functional Test Vector Generation for Digital LSI/VLSI Devices, 1983 International Test Conference, pp. 682–691, 10/18/83.

Mukundan, R. et al, Hardware Simulation of Clock Synchronization by Discrete Control Correction, Journal of Applied Science and Engineering, pp. 203–216, 11/18/75.

Mukundan, R. et al., Verification of Discrete Control Correction by Hardware Simulation, IEEE Transactions on Aerospace and Electronic Systems, pp. 600–604, 09/01/76.

Murakami, M. et al, Logic Verification and Test Generation for LSI Circuits, 1980 IEEE Test Conference, pp. 467–472, 01/01/80.

Nevitt, A. W. et al., Diagnosing LSI Component Failures, IBM Technical Disclosure Bulletin, vol. 23, No. 4, pp. 1514–1515, 09/01/80.

Nicholson, Barrie, High Reliability Component Tester, Electronics Industry, pp. 13–17, 01/01/81.

Nicholson, Barrie, Component Tests Automate Goods Inward QC, Electronics Industry, pp. 26–34, 02/01/81.

Nutburn, P. G., Economic Considerations of Testing Integrated Circuits, Electronic Engineering, pp. 143–144, 11/01/79.

Ohteru, S. et al, Digital Circuit Test System Using Statistical Method, 1980 IEEE, pp. 179–181, 01/01/80.

Pastrick, H. L. et al, The Efficacy of Hardware in Validating Hardware-in-the-Loop Simulations, U.S. Army Missile Research, Devel. & Eng. Lab. and Code Research Corp., pp. 561–571.

Perkins, C. C. et al, Design for In–Situ Chip Testing With a Compact Tester, 1980 IEEE Test Conference, pp. 29–41, 01/01/80.

Pfister, G. F., The IBM Yorktown Simulation Engine, Proceedings of the IEEE. vol. 74, No. 6, pp. 850–860, 06/01/86.

Pohl, von Volker, Das Testen Komplexer Digitaler Schaltungen, Technisches Messen tm, pp. 47–52, 01/01/80.

Pohlmann, B. et al, Testen von LSI–Leiterplatten, Messen+Prufen/automatik, pp. 117–120, 03/01/79.

Puckett, R. R., Standard Schottky TTL ICs Emulate MOS Logic Designs, Electronic Design, pp. 163–168, 03/17/83.

Puri, P. et al, How to Use a General Purpose Tester as a Custom VLSI Design Tool, 1980 IEEE Test Conference, pp. 421–425, 01/01/80.

Ripley, K., Testing Microprocessor–Based Circuits, Electronic Engineering, pp. 66–68, 10/01/87.

Salyer, G., Hardware Modeling of LSI Logic Using Microprocessors, IBM Technical Disclosure Bulletin, pp. 2247–2248, 11/01/77.

Schurmann, H. D. et al., An Interactive Test Data System for LSI Production Testing, IBM Data Systems Division, pp. 362–366, 01/01/80.

Shinn, R., Test Systems Spot More Errors, Sooner, Electronic Design, pp. 71–72, 09/01/80.

Smith, Dennis E., Automatic Optimum–Seeking Program for Digital Simulation, Simulation, pp. 27–31, 07/01/76.

Tarico, Frank, Transform uP Development Systems Into Low–Cost LSI Testers, EDN, pp. 101–104, 08/20/77.

(List continued on next page.)

OTHER PUBLICATIONS

Tashioglou, K. P., Current Aspects of LSI Board-Level Testing, Electronic Engineering, pp. 109–119, 04/01/79.

Thompson, Edward W., Simulation—A Tool in an Integrated Testing Environment, 1980 IEEE Test Conference, pp. 7–12, 09/01/80.

Tong, L. C., A Logic Simulation System Using Interactive Hardware, PhD Thesis, The University of Manchester, pp. 1–140, 10/01/74.

Tong, L. C., Gourley, S. F., Logic Simulation Using Interactive Hardware, Computer-Aided Design, vol. 9, No. 2, pp. 99–102, 04/01/77.

Valid Logic Systems, Realfast Simulation Accelerator, Brochure, pp. 1–6, 07/01/84.

Valid Logic Systems, Realmodel Simulation System, Valid Logic Systems, pp. 1–6, 10/1/85.

Valid Logic Systems, Networked Realchip Hardware Modeling System, Brochure, pp. 1–4, 2/1/86.

Valid Logic Systems, SCALDsystems I and II, Brochure, pp. 2–12, 06/01/84.

Valid Systems, Inc., SCALD Logic Simulator, Brochure, pp. 1–4, 04/01/84.

Valid Systems, Inc., Realchip Modeling System, Brochure, pp. 1–6, 03/01/84.

vanCleemput, W. M., Design Automation Tools for Structured Hardware Design, Digital Systems Laboratory, pp. 1–11.

VLSI Design Staff, Physical Models for Logic Simulation, VLSI Design, pp. 62, 64, 67, 06/01/84.

West, B. G., LSI PC Assembly Testing Using Parallel Pin Electronics, Solid State Technology, pp. 80–82, 10/01/78.

West, G. L. et al, A Microcomputer-Controlled Testing System for Digital Integrated Circuits, IEEE Transactions on Industrial Electronics and Control Instrumentation, pp. 279–283, 11/01/80.

Whittemeore, H. B., Wolfson, W. D., Using a New Tool for LSI Board Test, Data General Corporation, pp. 214–220.

Widdoes, et al, CAE Station Uses Real Chips To Simulate VLSI-Based Systems, Electronic Design, pp. 167–175, 03/22/84.

Wiles, Douglas, Functional Modeling of LSI for Simulation, GenRad, Inc., pp. 221–227, 1/1/80.

Williams, Tom, CAE System Ties Real Chips Into Software Model, Computer Design, pp. 78, 80, 04/01/84.

FIG. 17A
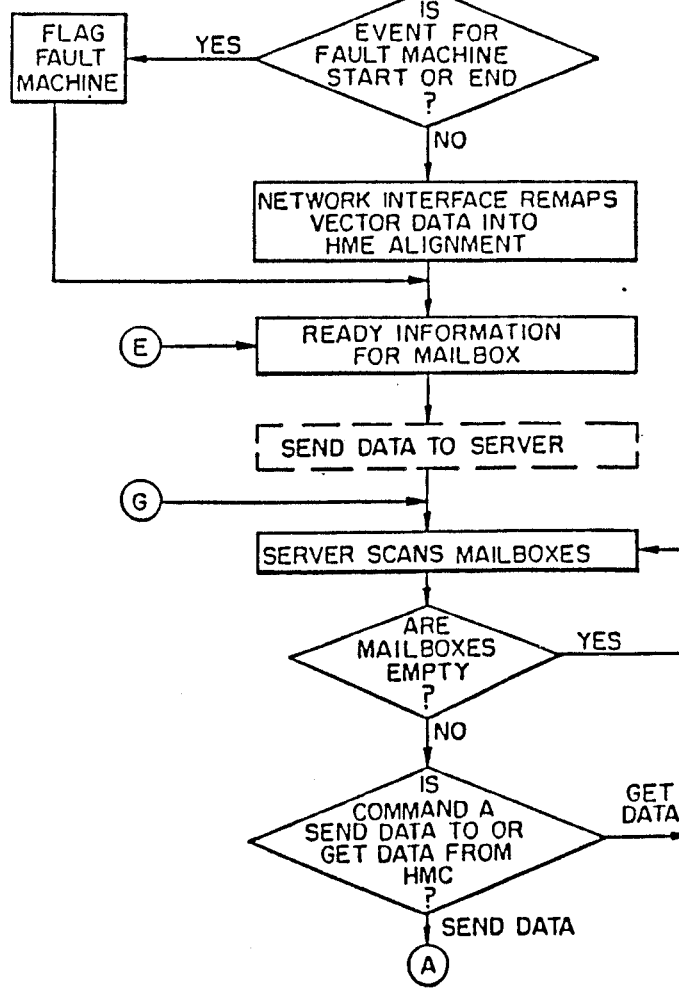
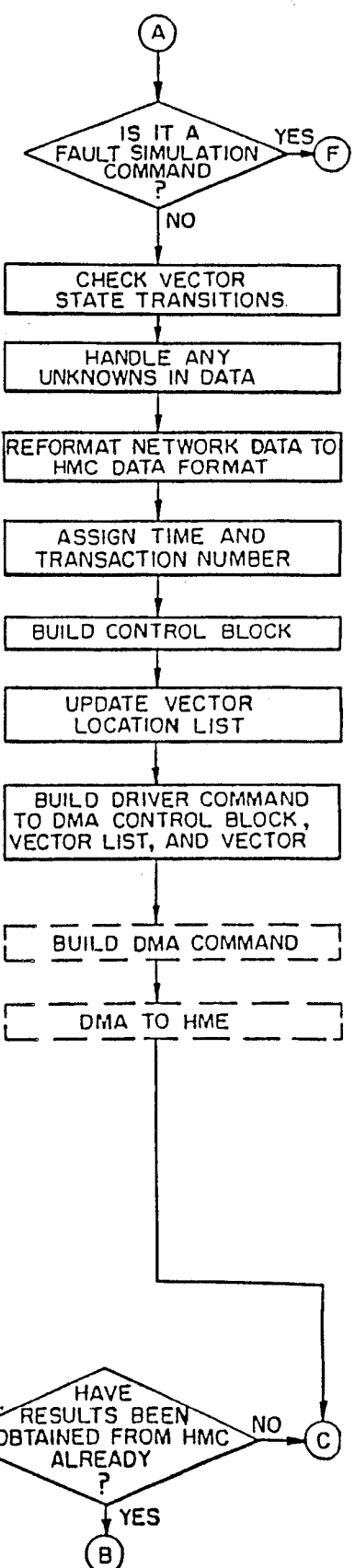

CIRCUIT VERIFICATION ACCESSORY

CROSS REFERENCE TO CO-PENDING APPLICATION

This application is a continuation of copending application Ser. No. 07/148,993, filed Mar. 18, 1988, now abandoned which in turn is a division of Ser. No. 07/070,598, filed July 8, 1987, now U.S. Pat. No. 4,744,084, which in turn is a continuation of Ser. No. 06/832,838, filed Feb. 2, 1986, now abandoned, which in turn is a continuation-in-part of Ser. No. 06/707,497, filed Mar. 1, 1985, now abandoned.

BACKGROUND OF THE INVENTION

The present invention relates to a method and apparatus for simulating portions of electrical circuits by using actual hardware components, such as integrated circuits, printed circuit boards and electrical circuit subsystems, in the simulation.

Heretofore, software systems have been developed for modeling or simulating the performance of circuit components. Through the use of software models, the design and engineering of electrical circuits is facilitated. Although these devices have proven to be powerful tools in aiding circuit designers, drawbacks exist, especially in software modeling of large-scale integrated and very-large-scale integrated circuit devices, such as microprocessors. For these latter devices, it is time-consuming and expensive to create software models. In this regard, the length of time required to prepare such models makes it difficult to create models as rapidly as new circuit designs evolve. Furthermore, complex software models are difficult to test and sometimes suffer from less than optimal reliability. Moreover, proprietary circuit designs are . typically not subject to modeling unless the owner of the design releases sufficient information to enable the creation of a software model. Owners of circuit designs are frequently reluctant to provide such information.

In an attempt which partially addresses these problems, Daisy Systems and Valid Logic Systems, have developed devices designated respectively as "PMX" and "Real Chip". In each of these devices, a circuit designer uses a workstation equipped with software models of a number of circuit components. Each workstation is also connected to its own dedicated hardware component modeling unit. These hardware component modeling units contain actual integrated circuit components for use in modeling. When a user at a workstation is evaluating a circuit design having components corresponding to one or more of the hardware components in the hardware component modeling unit, the corresponding hardware component in the hardware modeling unit is accessed and is used for modeling. That is, test data is fed from the workstation to the physical component in the hardware modeling unit. Test results are then returned from the hardware modeling unit to the workstation following the test. In this way, an actual hardware component is used in modeling in lieu of a software model.

These existing devices suffer from a number of limitations. In the first place, as explained above, each workstation is associated with its own dedicated separate hardware modeling unit. Therefore, for example, four such workstations require four hardware modeling units. Consequently, to provide each user with access to a given integrated circuit for modeling, one of these integrated circuits must be provided in each of the hardware modeling devices. This can be prohibitively expensive. Moreover, it may be difficult or impossible in the case of proprietary circuits, where only one or a few such circuits are in existence.

The "PMX" and "Real Chip" devices also suffer from a variety of technical deficiencies. For example, they are understood to lack the capacity to clock the hardware components at very high speeds, required by some components to maintain them in an active condition, and lack other features which are desirable in circuit modeling systems.

Therefore, a need exists for an improved hardware modeling circuit system and method which is directed toward solving and minimizing these and other problems of prior art devices.

SUMMARY OF THE INVENTION

In accordance with one aspect of the present invention, a hardware modeling circuit system provides users at plural workstations with access to a hardware modeling circuit means on a shared basis. The hardware modeling circuit means includes means for applying test data to pins of one or more hardware modeling elements, such as integrated circuits, printed circuit boards and circuit subsystems. In addition, the hardware modeling circuit means includes means for retrieving resultant data generated from the hardware modeling elements during an evaluation. Optional timing analyzer means provides time analysis of outputs from pins of the hardware modeling elements under test and permits observation and evaluation of asynchronous signal behavior in the resultant data.

As a further feature of the present invention, clocking means are provided for generating high frequency device clocking signals for clocking hardware modeling elements at frequencies required to maintain such elements in an operational state. Moreover, the frequencies and other characteristics of these signals are variable. For example, the clocking frequencies can be varied as required to clock the hardware modeling elements from 12.2 kilohertz to 16.67 megahertz in twenty nanosecond increments.

As a further feature of the present invention, the hardware modeling circuit means includes means for employing software-generated phase clocks, as required for complex hardware modeling elements.

As a still further feature of the present invention, a tri-state sensing means and technique is employed for detecting high impedance states on the output pins of the hardware modeling elements As still another feature of the invention, the hardware modeling circuit means includes means for detecting bus collisions between the hardware modeling circuit means and the pins of the hardware modeling elements and for limiting the current at such connections to prevent device burnup or overheating.

In addition to permitting timing analysis of actual test results, the apparatus of the invention also permits timing evaluation from software file data which specifies the minimum, maximum and typical ranges of timing parameters for the hardware modeling device used in the modeling.

As still another feature of the present invention, the hardware modeling circuit means includes means for providing clocking and control signals to the integrated circuit or printed circuit board subsystem modeling elements as required, thereby synchronizing the operation of these hardware modeling elements with the hardware modeling circuit means.

As still another feature of the present invention, unique gating circuit means are employed to access the pins of hardware modeling elements, such gating circuit means incorporating one or more of the above features.

As a further aspect of the present invention, means are provided to automatically partition the system memory to facilitate use by a plurality of users.

Therefore, it is an overall object of the present invention to provide an improved hardware modeling circuit system, improved hardware modeling circuit means, and improved gating circuit means for utilizing hardware modeling elements in electrical circuit simulations.

These and other features, objects and advantages of the present invention will become apparent with reference to the following description and drawings.

BRIEF DESCRIPTION OF THE DRAWINGS

FIGS. 17a through 17e are flow charts describing the operation of the network interface of the system of FIG. 1;

DETAILED DESCRIPTION OF A PREFERRED EMBODIMENT

Figure 1:
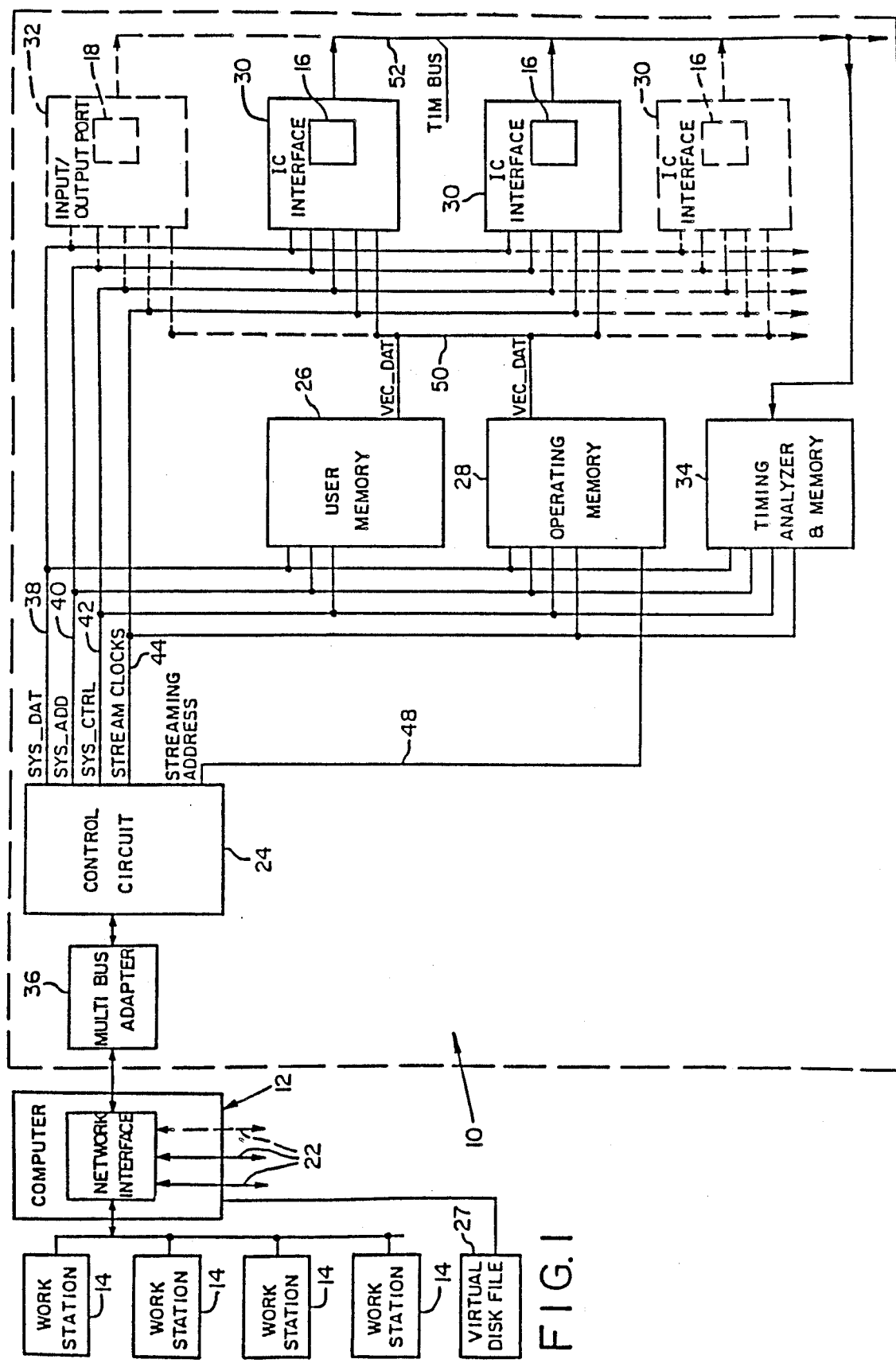
FIG. 1 is an overall block diagram of a hardware modeling circuit and system in accordance with the present invention.

With reference to FIG. 1, the hardware modeling circuit system of the present invention includes a hardware modeling circuit means 10 which is interfaced by a computer network interface means 12 with plural electrical circuit simulation workstations 14 on a shared network basis. Hardware modeling circuit 10 is adapted to receive plural integrated circuit components, some of which are indicated schematically at 16, as well as printed circuit boards or circuit subsystems, as indicated schematically at 18. These integrated circuits, printed circuit boards and circuit subsystems are collectively and individually designated as "hardware modeling elements" or "HMEs." As explained below, these hardware modeling elements are accessed and used in simulating components in circuits being designed at the workstations 14.

In general, workstations 14 are designed to perform computer simulation of circuits being designed and evaluated at such stations. The workstations typically include software models of components of circuits being analyzed. Through the use of such software models, circuit design and evaluation is facilitated. Such workstations are presently being produced by companies such as Mentor Graphics Corporation, Daisy Systems and Valid Logic Systems.

As previously explained, there are limitations in the use of software models for circuits. To overcome these limitations, the present invention provides the workstations 14 with access to actual physical hardware modeling elements 16, 18 as required. The physical hardware modeling elements are thus used in circuit simulation in place of software models of such elements. In general, when a workstation 14 recognizes that a circuit component used in a design or evaluation corresponds to one of the hardware modeling elements 16, 18 in the hardware modeling circuit 10, that element is accessed by the workstation through the network interface 12. Insofar as the user is concerned, software models and hardware modeling elements co-exist and are available for use in the simulation. Stimulus vectors, or input test data, generated at the workstation in the same manner as such vectors are generated for a software-evaluated model, are transmitted to the hardware modeling circuit 10 and corresponding stimuli signals are are applied to the appropriate pins of the corresponding hardware modeling element. The resultant output signals from the hardware modeling element 16, 18 are converted into corresponding resultant test data and returned from the hardware modeling circuit 10, via network interface 12, to the appropriate workstation 14 upon completion of an evaluation. Thus, the network interface 12 functions as a means for receiving input test data from a workstation and as a means for receiving the resultant test data from the hardware modeling circuit Plural workstations are coupled to the network interface 12, and thus to the hardware modeling circuit 10, by a commercially available local area network, such as the Domain TM network from Apollo Computers, Inc. Network interface 12 also comprises a computer, such as an Apollo Model No. DSP-80(A), programmed as shown in the flow charts of FIGS. 17a through 17e. Not only does network interface 12 permit sharing of a single hardware modeling circuit 10 by plural workstations 14, it also permits sharing of additional hardware modeling circuits 10 which may be coupled to the interface, as indicated schematically by lines 22. In this manner, a substantial library of hardware modeling elements 16 and 18 are available, with each workstation having shared access to all of the hardware elements in the library. Duplicate hardware modeling elements 16, 18 are thus not needed in the hardware modeling circuits 10 because each of the workstations has access to all of the hardware modeling elements in the system.

The hardware modeling circuit 10 includes a control circuit 24, a user memory 26, an operating memory 28 and plural integrated circuit interfaces 30, which support the integrated circuit hardware modeling elements 16. User memory 26 may be augmented by additional memory such as an optional virtual disk file 27. In addition, an input/output port 32, which may be similar to the integrated circuit interfaces 30, is provided for coupling the hardware modeling circuit 10 to printed circuit boards and subsystems 18 when such elements are used in modeling. A timing analyzer 34 is also provided for performing timed analysis on resultant data generated from the hardware modeling elements during an evaluation. The control circuit 24, and thus the hardware modeling circuit 10, is connected to the network interface 12 by a coupler 36. One suitable coupler is a Multi-Channel TM coupler, such as a Multi-Bus TM circuit board Model 53C (Single Board Computer)-589, available from Intel Corporation. The interconnection of these components of the hardware modeling circuit 10 and their general functions will next be described.

As explained in greater detail below in connection with FIG. 2, the control circuit 24 is a microprocessor based circuit that performs a variety of functions. The control circuit generates the various clocking signals required for a circuit simulation; establishes the proper data flow paths through the various blocks of the hardware modeling circuit 10; starts and stops the application of stimulus data to the various hardware modeling elements and determines whether timing analysis is to be performed by the timing memory circuit 34; monitors the commands from a software server run on the network interface computer 12; and sets up and initializes direct memory access (DMA) transfers of data from the user memory 26 to the operating memory 28. Thus, the control circuit 24 coordinates the data movement between the various components of the hardware modeling circuit 10.

More specifically, the components of the hardware modeling circuit are interconnected as follows. A sixteen bit bidirectional data bus (SYS—DAT) 38 interconnects the control circuit 24, the integrated circuit interfaces 30, the input/output port 32 and the timing analyzer 34. A twenty-four bit address bus (SYS—ADD) 40 and a system control bus (SYS—CTRL) 42 also interconnect these same elements In addition, a STREAM CLOCKS bus 44 interconnects each of these elements except the user memory 26. A STREAMING ADDRESS bus 48 couples the control circuit to the operating memory 28. A two hundred fifty-six bit vector data (VEC—DAT) bus 50 interconnects the user memory 26 to the operating memory 28, to integrated circuit interfaces 30 and to input/output port 32. Finally, a sixty-four bit unidirectional timing (TIM) bus 52 couples the integrated circuit interfaces 30 and input/output port 32 to the timing analyzer 34.

In general, data (i.e. stimulus data from a user's workstation 14 which is to be applied to a particular hardware modeling element 16, 18), as well as address and other information, is loaded into user memory 26. Server software in network interface 12 partitions the user memory 26 for reception of data from a user. This software also manages the virtual user memory disk file 27 discussed below. User memory 26 typically is from one to eight megabytes of dynamic MOS RAM. This memory is relatively slow, but is not used in applying stimulus vector data to the hardware modeling elements 16, 18. Instead, this memory temporarily stores data from one or more users prior to delivery of one user's data to the operating memory 28. The operating memory 28 and user memory 26 are independently operable such that data for simulation experiments from one or more users may be loaded into the user memory 26 while data vectors for one user's evaluation are being applied from the operating memory 28 to the selected hardware modeling element 16, 18.

Following the completion of a user's evaluation or experiment, information pertaining to the next user's evaluation is transferred from user memory 26 to the operating memory 28 under the direction of control circuit 24. Operating memory 28 provides storage of stimulation vectors for an evaluation by one user immediately before these vectors are transferred to a desired hardware modeling element 16, 18 for a simulation evaluation cycle.

The operating memory 28 comprises a high-speed static RAM memory. During an evaluation cycle, vector data stored in operating memory 28 is clocked by the STREAM CLOCKS 44 to the selected hardware modeling element 16, 18. As explained below, this clocking rate is variable to fit the requirements of the particular hardware modeling element being used in the evaluation. Moreover, in the illustrated embodiment of the present invention, a clocking rate of up to 16.67 megahertz is provided so that high speed hardware modeling elements can be clocked fast enough to maintain them in an operational state. Operating memory 28 typically comprises either two parallel circuit boards (each 16 k by 128), for a total storage of 16 k by 256, or alternatively two sets of such boards, for a total storage of 32 k by 256. In the former case, the operating memory 28 is capable of storing 32k vectors (each vector being two hundred fifty-six bits) for each pin of a 64 pin device; 16 k vectors for each pin of a 128 pin device; or 8 k vectors for a 256 pin device. The above storage is doubled in the case where two sets of operating memory boards are utilized. Thus, the operating memory 28 is expandable to accommodate a large number of stimulus vectors for any one hardware modeling element 16, 18.

To conserve storage, as the pin count of a hardware modeling element exceeds 128, data is loaded into successive word block positions in the operating memory 28 and successively applied to a hardware modeling element 16, 18 under test. The resultant data from the hardware modeling element is then multiplexed and time aligned.

The data from the operating memory 28 is clocked to the appropriate hardware modeling element 16, 18 in response to a signal on the STREAM CLOCKS bus 44. That is, in response to the clock signal, data from the operating memory 28 is clocked into input registers of the appropriate integrated circuit interface 30 via the vector data (VEC_DAT) bus 50. Address information is provided along STREAMING ADDRESS bus 48 for the data stored in the operating memory 28.

For each pin of the hardware modeling element, the VEC_DAT bus 50 carries two bits of information. One is a control bit that indicates whether the hardware modeling system is to drive the pin or receive data from it. The other bit is a data bit. Consequently, VEC_DAT bus 50 carries twice as many bits of data as there are pins in the hardware modeling element. Since VEC_DAT bus is only 256 bits wide, it can normally only support a 128-pin device. Two support a 256-pin device, as explained below, two consecutive transfers to an ICIF 30, or to the Input-port 32, are made in the VEC_DAT bus. The ICI_CLK1 and ICI CLK2 busses are used for this purpose. The ICI_CLK1 clocks the first 256 bits across the VEC DAT bus, while the ICI_CLK2 clocks the second 256 bits. After all data has been transferred, the master clock, MAS_CLK, then passes all of these data and control bits to the pins of the hardware modeling elements 16, 18 mounted to the ICIF or the input-output port.

Following an explanation, in response to a read signal on system control (SYS_CTRL) bus 42, resultant data is transferred from IC interface board sample registers to the system data (SYS_DAT) bus 38 when timing analysis is not used, or from the timing analyzer 34 when timing analysis is used. From the system data bus 38, the resultant information is fed to the user's workstation 14.

In a situation in which timing analysis is employed, a control signal on system control bus 42 enables the timing analysis portions of the hardware modeling circuit 10, as explained below. In general, during timing analysis, desired pins of the hardware modeling element 16, 18 are sampled at a periodic rate, for example at a 100 megahertz sampling rate. The sampled data from these pins permits a user to observe timing behavior, such as asynchronous behavior of a hardware modeling element. This provides a more accurate representation of the modeling element's timing characteristics.

An individual hardware modeling element has its own timing characteristics and does not model the range of minimum to maximum timing characteristics applicable to other elements of the same type. Where such information is needed, instead of, or in addition to, utilizing timing analysis, timing information can be software generated in the same manner as presently employed in existing software modeling systems. That is, timing data pertaining to a particular hardware modeling element 16, 18 may be stored in a software file that can be accessed by the workstation 14. For example, this timing data may comprise minimum, typical and maximum response times for the hardware modeling element 16, 18. Timing information can be computed from this data.

Figure 2:
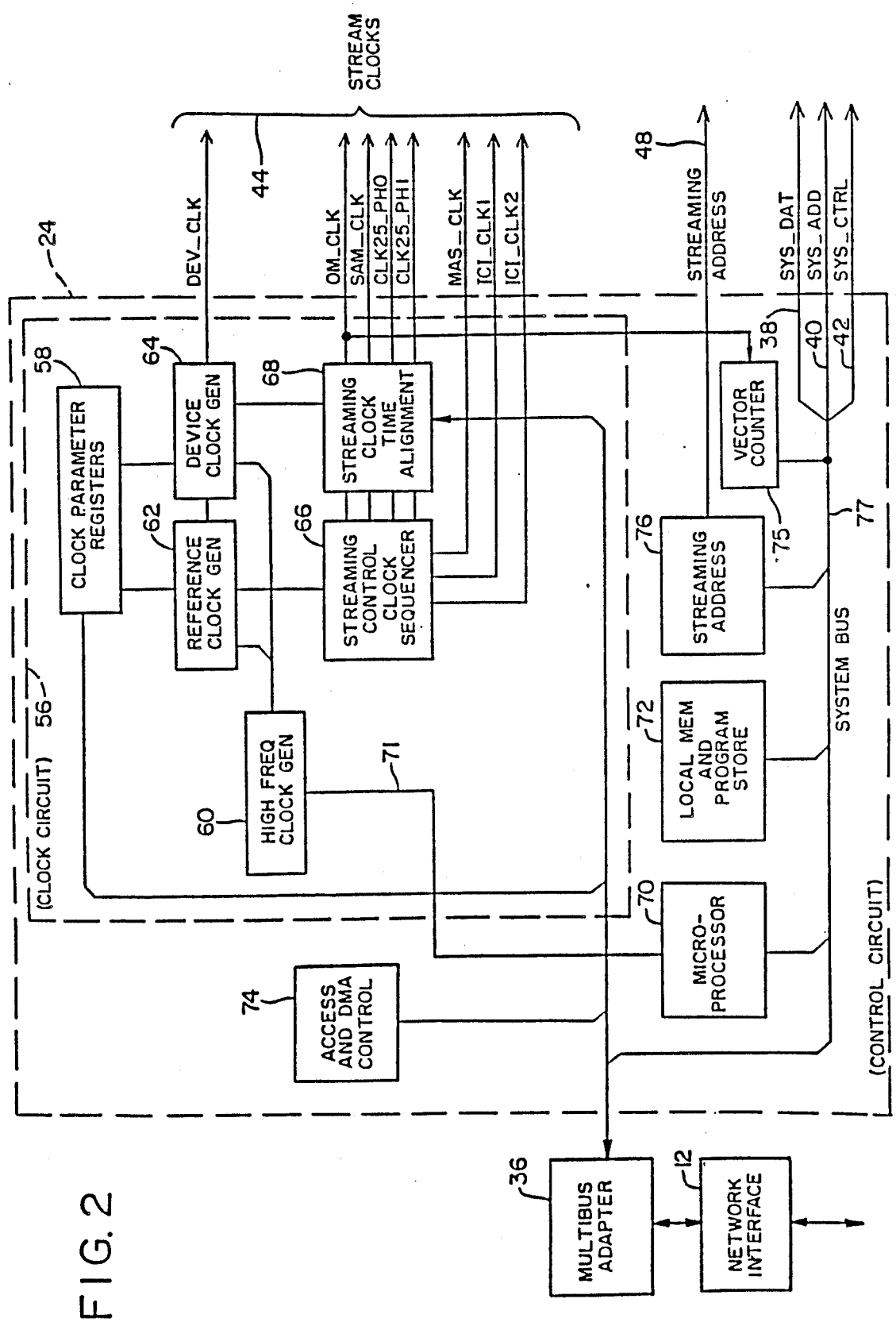
FIG. 2 is a block diagram of the control circuit utilized in the hardware modeling circuit of the system of FIG. 1.

With reference to FIGS. 1, 2, 3 and 6, the control circuit 24 will be described in greater detail. In general, the control circuit includes a clock circuit portion 56, described in greater detail in the Clock Circuit description below, for generating the clocking signals on STREAM CLOCKS bus 44. These signals are indicated in FIG. 2 and defined below. More specifically, clock circuit 56 includes a clock parameter register 58, a high frequency clock generator 60, a reference clock generator 62, a device clock generator 64, a streaming control clock sequencer 66 and a streaming clock time alignment circuit 68. When establishing an evaluation, a user at a workstation 14 can select the desired clocking waveform type, clocking frequency and duty cycle. This information is fed to the clock parameter register 58, which in turn causes the reference clock generator 62 and the device clock generator 64 to produce device clocking signals for the hardware modeling elements 16, 18, corresponding to these parameters.

In the illustrated embodiment, the waveform generators 62 and 64 are used to create all clock signals for a hardware modeling element 16, 18. Typically, these waveforms include non return to zero signals, return to zero signals and return to one clocking signals. Moreover, the clocking frequencies are controllable by the user from, in the preferred embodiment, 12.2 kilohertz (81.94 microseconds) to 16.67 megahertz (60 nanoseconds), in 20 nanosecond increments. In generating the required clocking signals, the high frequency clock generator 60 produces clocking signals at the maximum signal frequency rate, which in turn control and synchronize the reference clock generator 62 and device clock generator 64. Streaming control clock sequencer 66 and streaming clock time alignment circuit 68 sequence the clocking signals at the appropriate times to produce the required clocking signals for the hardware modeling circuit 10.

In addition to a clock circuit 56, control circuit 24 includes a microprocessor 70, such as an Intel 80186 microprocessor, which executes a software program stored in a local memory and program store 72. The programming of the microprocessor 70 will be apparent with reference to the description below and from the flow chart of FIG. 6. The control circuit 24 also includes an access and DMA control 74 for controlling the transfer of information to and from the user and operating memories 26, 28 and the network interface 12. A streaming address circuit 76 is provided for delivering address information to the operating memory 28 on streaming address bus 48. Microprocessor 70, local memory and program store 72, access and DMA control 74, and streaming address circuit 76 are interconnected by a SYSTEM BUS 77 which provides the system data, system address and system control outputs on busses 38, 40 and 42.

When the simulation software running on a workstation 14 needs to evaluate a hardware modeling element 16, 18, it passes a request to the server software running on the network interface computer 12. If this is the first request for a simulation, the server will examine its map of user memory 26 to allocate four areas of storage: (1) task control block; (2) vector data block; (3) linked-list; and (4) results area. The purpose of these four areas of storage is individually detailed below.

The task control block embodies setup and run-time configuration information for a simulation experiment. The following information is provided in a task control block: Address of the hardware modeling element 16, 18 on which the evaluation is to be performed (IC interface board number and the socket number on that interface board where the hardware modeling element is installed); clocking information (clock period, data/- clock setup time, clock duty cycle); a flag to determine whether timing analysis is to be used; an address pointer to the location in which the results of the evaluation are to be placed; the transaction code to be returned in the results queue upon completion of the task; a list of clock, open-collector, tri-state, and input/output pins for the hardware modeling element; the number and location of unknowns; and an address pointer to the vector data linked-list.

The vector data block contains the stimulus data for the hardware modeling element 16, 18. This block expands with each new evaluation cycle. The newest vector is appended to the end of any existing vectors.

The linked-list contains linkage information for discontiguous blocks of vector data. As a simulation evolves over time, the size of the vector data block grows. The server software may need to break up the data block into two or more discontiguous pieces to fit it into available memory space. Being able to break the large block into several smaller ones facilitates operation of the hardware modeling system 10 during multiple, concurrent simulations. The linked-list provides a mechanism for the server software and control circuitry to maintain continuity between the discontiguous blocks. Each element in the linked-list contains three pieces of information pertaining to one data block: (1) size of the block (byte count); (2) address pointer to the location in user memory 26 of the block; and (3) address pointer to the next element in the linked-list. The linked-list block may potentially cause the same problem as the vector data block. That is, it may grow to be so large that it must be broken in two or more pieces for it to fit into available memory space. The address pointer to the next linked-list element provides a means by which the elements of the linked-list may be chained together.

Finally, the results area is provided for storage of the results data generated by the evaluation cycle. The control circuit 24 deposits the data in the results area and the server software recovers it.

In general, when the simulation software running on the workstation 14 requires an evaluation of a hardware modeling element 16, 18, it passes the request to the server software running on the network interface computer 12. The server builds a task control block, passes it to user memory 26 and deposits an address pointer to the task control block into a command queue in user memory.

Control circuit 24 continuously scans the command queue. When it sees any non-zero value, it assumes the value to be a valid address pointer to a task control block. The control circuit 24 decodes the information in the control block and performs the appropriate setup of the clock circuit 56, streaming address circuit 76, and IC interface 30 or input/output port 32.

The control circuit 24 reads the linked-list and uses the address pointers and block size information to locate each of the vector data blocks and to DMA transfer them one at a time from user memory 26 into operating memory 28. The control circuit employs the access and DMA control circuits 74 to perform the transfer operations. The first block for any given evaluation is loaded into operating memory 28 starting at address zero. Any additional blocks for the same evaluation are successively appended to the end of previously transferred blocks and thereby assembled into a contiguous block. Any "unknown" in the vector data are treated as a logical one or zero, as selected by the user.

Figure 18:
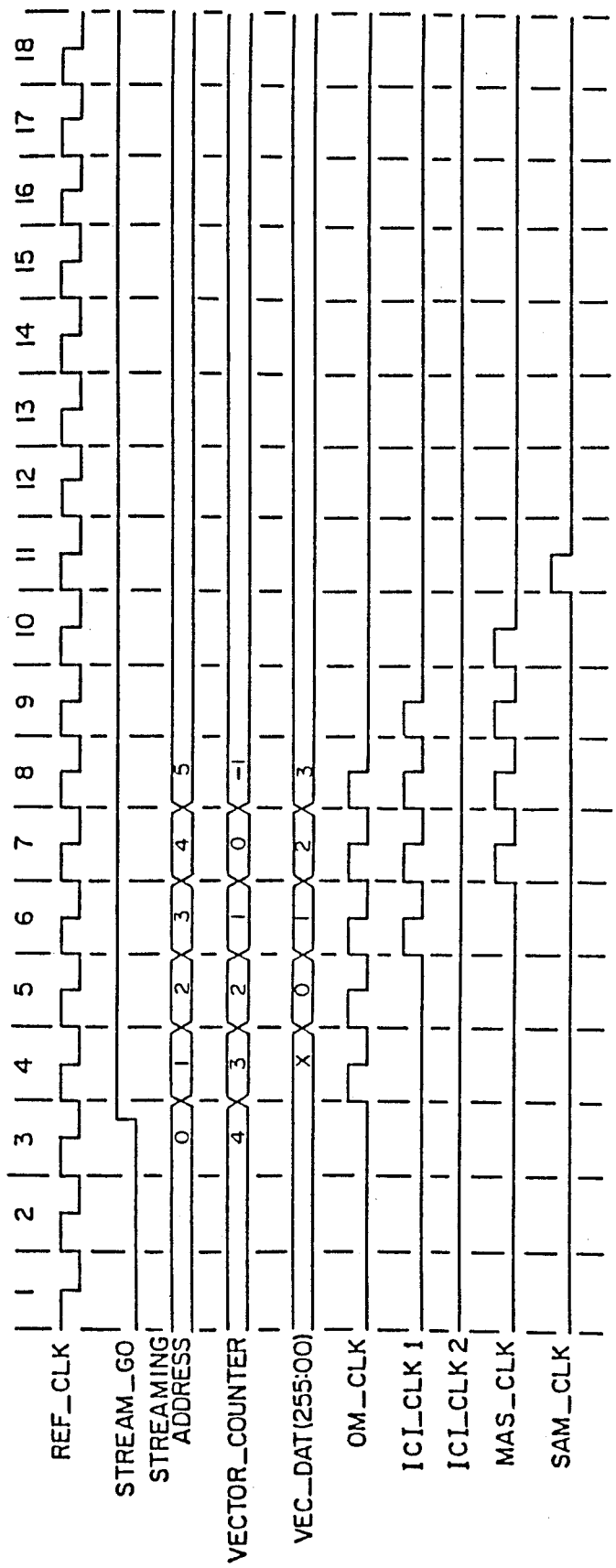
FIG. 18 is a timing example of a four vector transfer to a 64-pin or to a 128-pin hardware modeling element during an evaluation by the system of FIG. 1.
Figure 19:
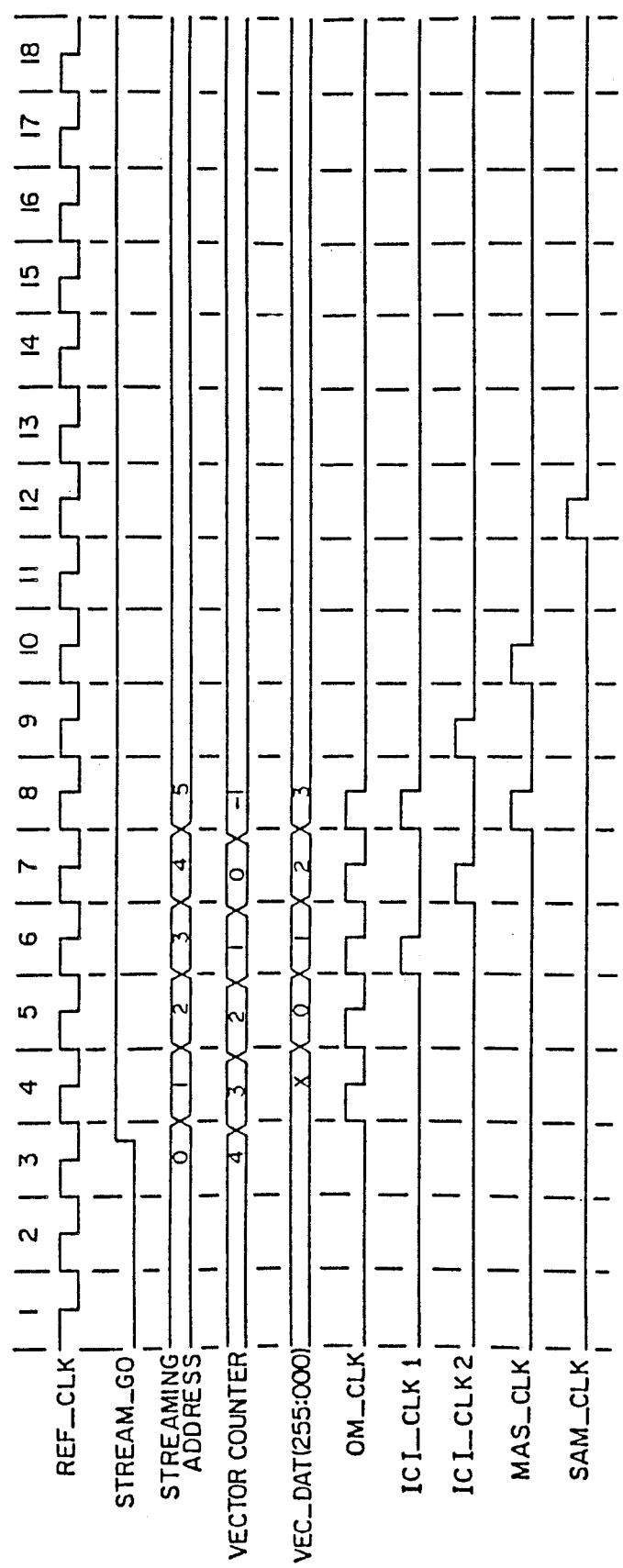
FIG. 19 is a timing example of a two double-vector transfer to a 256-pin hardware modeling element during an evaluation by the system of FIG. 1.

Once all the vectors have been placed in the proper order in operating memory 28 and the total number of vectors has been determined, the control circuit 24 sets a "go" bit in a control register that starts the autonomous clock circuit 56 (The use of this "go" bit is shown in the STREAM-GO lines of FIGS. 18, 19). The clock circuit generates the control clocks that move the data from operating memory 28 to the hardware modeling element 16, 18 through the IC interface board 30 or through the input/output port 32. This is clarified with reference to the description of the control clocks below and with reference to the timing diagram of FIG. 3. Once an evaluation has been started, the control circuit 24 waits for a "finished" flag from a vector counter 75 to go true. When the "finished" flag is true, the entire vector stream for the evaluation has been applied from operating memory 28 to the appropriate hardware modeling element 16, 18. Vector counter 75 counts the number of stimulus vectors remaining to be clocked to the hardware modeling element. The "finished" flag goes true when the vector counter reaches zero. (FIGS. 18 and 19 show the use of the signal from vector counter 75).

Because each simulation evaluation contains only one new vector, the last one in the entire vector stream, the only response from the hardware modeling element 16, 18 that is of interest is the response to the last vector applied. This response can be recorded in the form of a single response vector if timing analysis is not used. Alternately, the response is recorded as many successive high speed samples made by the timing analysis circuit 34.

If timing analysis is not used, the results of the evaluation are recovered from sample registers in the gate arrays, explained below, located on the IC interface board 30 or the input/output port 32. If timing analysis is used, the results of the evaluation are recovered from the memory of timing analysis circuit 34 and transferred to the results area in user memory 26 specified by the results address pointer in the task control block.

The control circuit 24 then zeros the entry in the command queue and writes the transaction number obtained from the task control block into the results queue. This signifies the completion of the task for the hardware modeling control circuit 24.

While any task is awaiting completion by the control circuit 24, the server software continuously scans the results queue. When it sees any non-zero value, it assumes the value to be a valid transaction number. Since the server software originally assigned the transaction number to the evaluation task, it can use the number to determine the proper address in user memory 26 to obtain the results. The server software retrieves the results from user memory 26 through the Multibus adapter 36 and passes them to the simulation software running on the workstation 14.

This completes one evaluation cycle of a hardware modeling element 16, 18.

Virtual Memory Management

The memory manager is a part of the server software that runs on the network interface computer 12. It controls the allocation of storage space within user memory 26. At the bottom of user RAM is a fixed length block of memory used for message passing between the server and the hardware modeling system firmware. This area is not under the control of the memory manager. All the remaining user RAM is used for vector data, task control blocks, linked-lists, and results areas. The memory manager controls this area of memory.

The memory manager does not differentiate between memory allocation for any particular function. The "free list" is a link data structure. Each element of the list represents a block of memory (256 bytes). All allocations are from the "free list" and all deallocations are to the "free list." There is a similar structure for maintenance of the virtual disk file 27. This latter file is optional and used to store vector data in excess of user RAM as explained below.

Each record for each hardware modeling element 16, 18 contains two indicators. The first indicator indicates whether data for the hardware modeling element currently resides totally in user RAM (in_memory). The second indicator indicates if an evaluation of that hardware modeling element is currently in process (in_que). The in memory indicator is maintained by the memory manager. The in_que indicator is maintained by the server and is used to determine if the data for the hardware modeling element can be safely swapped between user RAM 26 and the virtual desk file 27.

Under conditions of heavy use or limited user memory 26, there may be a shortage of space in user RAM. This occurs any time the total space taken by hardware modeling element data and system overhead exceeds the current amount of user memory 26 in the hardware modeling system. Should this happen, all of the vector data associated with one hardware modeling element 16, 18 will be swapped to the virtual disk file 27. That is, all vector data pertinent to that hardware modeling element is transferred to the network interface computer 12 and subsequently written to a file on a disk memory for storage. Once the data is transferred, all user RAM allocated to store that data is returned to the "free list" for reallocation.

The choice of which hardware modeling element data to swap is made by first checking for a hardware modeling element 16, 18 whose vector data has already been swapped. If none are found, then the hardware modeling element that was least recently used is choosen. If hardware modeling element is being evaluated, or has an evaluation pending (as a function of a command in the command que (in_que)), it will not be swapped. If no hardware modeling element data can be found to swap, the current command being processed will be halted until a swappable set of data is found, or until user memory is freed for some other reason, such as by returning results upon the completion of an evaluation.

The disk file 27 used to store hardware modeling element vector data is a temporary file partitioned into 2 kbyte segments. These segments are managed in much the same way that user RAM blocks are managed. When the vectors of a swapped hardware modeling element are copied back into the hardware modeling system 10, the disk image is maintained until the channel associated with it is closed. By saving these vectors on disk, if another swap is needed, only those vectors generated after the last swap need be transferred.

When the data associated with a hardware modeling element 16, 18 is not in user RAM (as indicated by the in_memory flag), it must be reloaded and rebuilt. The first step is to copy all vector data from the disk file 27 to a buffer in the server. Second, the server is instructed to reset the hardware modeling element. Third, the buffer is passed to the server and the server is instructed to rebuild the data blocks for the hardware modeling element. Finally the evaluation sequence is resumed.

Clock Circuit Description

With reference to FIGS. 1 and 2, the clock circuit 56 is that part of the control circuit 24 responsible for moving the hardware modeling element stimulus from operating memory 28 to the IC interface 30 or input-/output port 32, and for capturing any resultant response. The clock circuit is connected to the IC interface 30, the input/output port 32, the operating memory 28 and the timing analyzer and memory 34 by means of the STREAM CLOCKS bus 44.

Additionally, the clock circuit 56 provides high frequency device clocking signals for clocking hardware modeling element devices at frequencies required to maintain such devices in a functional state. Clock circuit 56 also provides the means to supply software generated phase clocks at software variable rates of from 12.2 KHz (81.940 microseconds) to 16.67 MHz (60 nanoseconds) in 20 nanosecond increments. Other suitable clocking rates may also be provided as needed.

Clocking signals are applied directly to integrated circuit modeling element 16 through the appropriate I.C. pins. Some printed circuit boards or circuit subsystems 18, however, have their own on-board oscillator circuits to generate system clocks. These devices are synchronized with the hardware modeling circuit system by disabling the on-board clocks and using instead the software generated clocks provided by the present invention.

The clock circuit 56 includes a clock parameter register 58, high frequency clock generator 60, reference clock generator 62, device clock generator 64, streaming control clock sequencer 66 and streaming clock time alignment circuit 68. Eight clocks are produced by clock circuit 56 for IC interface 30, input/output port 32, operating memory 28, and timing analyzer and memory 34 (if used). These clocks are as follows:

1. DEV_CLK provides means to supply a programmable hardware modeling element clock. This clock provides the signal that actually toggles the clock-pin(s) of the hardware modeling element being modeled.
2. MAS_CLK provides means to time align stimulus from operating memory. This clock is used to present the stimulus from the operating memory to the hardware modeling element 16, 18.
3. IC1_CLK1 provides means to time align stimulus from operating memory. This clock is discussed above with reference to the VEC_DAT bus 50.
4. IC1_CLK2 provides means to time align stimulus from operating memory. This clock is also discussed above with reference to the VEC_DAT bus 50.
5. SAM_CLK provides means to capture hardware modeling element stimulus response information. This clock provides signals after all stimuli have been applied to the hardware modeling element and controls the underwriting of the resultant hardware modeling element response.
6. OM_CLK provides means to move stimulus from operating memory. One stimulus vector is applied to the hardware modeling element for each OM_CLU pulse.
7. CLK25PH0 provides means to analyze timing of hardware modeling element components at the timing analyzed and memory circuit This clock provides signals used by the timing analyzer and memory circuit 34 to evaluate propagation delays among pins of the hardware modeling element with better granularity than would otherwise be available.

8. CLK25PHl also provides means to analyze timing of hardware modeling element components at the timing analyzer and memory circuit. This clock is used in conjunction with CLU25PHO above.

High Frequency Clock Generator

The high frequency clock generator 60 provides the fundamental operating frequency signals for the hardware modeling circuit system 10. To achieve a high degree of accuracy and provide required programmability of the device clocks, a 100 megahertz crystal oscillator is used. This provides 10 nanosecond timing states for the hardware modeling circuit system.

Additionally, the high frequency clock generator 60 provides two 25 megahertz timing memory clocks (CLK25PHO and CLK25PHl), phase shifted 90 degrees, for the timing analyzer and memory 34. Clock generator 60 also provides a microprocessor clock on a line 71 for the control circuit microprocessor 70.

Clock Parameter Registers

The clock parameter registers 58 provide the means for programming the fundamental device frequency, duty cycle and time alignment parameters. There are four clock parameter registers as follows:
1. REF_CLK frequency register.
2. DEV_CLK setup delay register.
3. DEV_CLK hold delay register.
4. Time Alignment register.

REF_CLK frequency register

The REF_CLK frequency register provides a programmable means for supplying variable frequencies to hardware modeling elements 16, 18 as required by these elements to maintain them in a functional state.

Loading of this register is accomplished with the microprocessor 70 supplying the register's address and data collected and calculated from the task control block in user memory 26. In the exemplary embodiment, the allowable frequency register values are one (1) through 4095 inclusive. A value of zero is not permitted.

Each increment of the frequency register value increases the REF_CLK period by 20 nanoseconds. For example, a one (1) written to this register specifies to the reference clock generator 62 a device clocking period of 60 nanoseconds. A value of 4095 specifies a device clocking period of 81.94 microseconds.

DEV_CLK setup delay register

The DEV_CLK setup delay register provides a means for supplying variable device setup times to hardware modeling elements 16, 18 as required by these elements to maintain them properly stimulated. The DEV_CLK setup delay register affects only DEV_CLK generation.

Setup times are provided by varying the DEV_CLK leading edge while holding the operating memory 28 stimulus application point, MAS_CLK, fixed in time.

Figure 3:
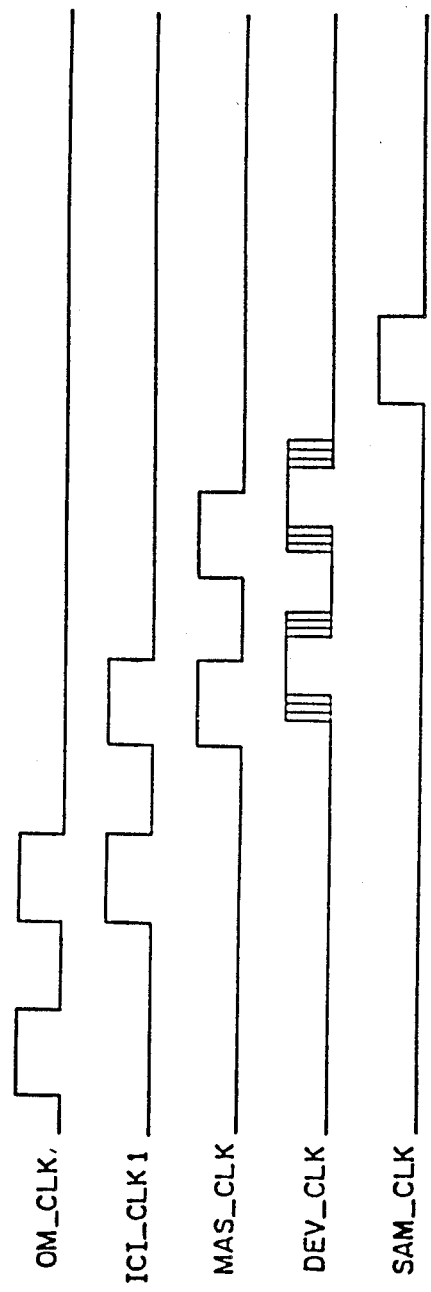
FIG. 3 is a timing example of a two vector data stream processed by the system of FIG. 1.

Each increment of the value in the setup register specifies the number of 10 nanosecond delay periods that will elapse from the positive going edge of a MAS_CLK pulse before the occurrence of the positive edge of DEV_CLK signals. This programmable delay is illustrated by several possible positions of the DEV_CLK pulses relative to the MAS_CLK pulses as shown in FIG. 3. Values for this register's contents must be less than the value of the hold delay register. In this specific illustrated embodiment, acceptable values are from one (1) to 4095 inclusive. A value of zero is not permitted.

DEV_CLK hold delay register

The DEV_CLK hold delay register provides a programmable means for supplying variable device hold times to hardware modeling elements 16, 18 as required by these elements to maintain them properly stimulated. The DEV_CLK hold delay register affects only DEV_CLK generation.

Hold times are provided by varying the DEV_CLK trailing edge while holding the operating memory 28 stimulus application point, MAS_CLK, fixed in time. This is also shown in FIG. 3.

Each increment of data in the hold register specifies the number of 10 nanosecond delay periods that will elapse before the deassertion of DEV_CLK. Values for this register's contents must be greater than the value of the setup delay register since DEV_CLK is not asserted until the setup delay period has elapsed. In the illustrated embodiment, acceptable values are from one (1) to 4095 inclusive. A value of zero is not permitted.

Time Alignment Register

The time alignment register provides a programmable means of compensating for standard component tolerances, for allowing variable amounts of settling time for device response capture, and for providing increased resolution and accuracy during timing analysis.

The time alignment register holds three fields of three bits each for providing the means to add delays to four of the eight streaming clocks, namely: OM_CLK, SAM_CLK and the two timing memory clocks CLK25PHO and CLK25PHl. The three fields of programmable delay are listed below:
1. OM_CLK delay.
2. Timing memory clocks delay.
3. SAM_CLK delay.

For the case of OM_CLK delay, the three bit field specifies increments of two nanoseconds for values from zero to seven. This provides a maximum delay of fourteen nanoseconds of the OM_CLK with respect to MAS_CLK, ICI_CLK1 and ICI_CLK2.

For the case of timing memory clocks delay, the three bit field specifies increments of two nanoseconds for values from zero to seven. This also provides a maximum delay of fourteen nanoseconds of the timing memory clocks with respect to MAS_CLK, ICI_CLK1 and ICI_CLK2.

For the case of SAM_CLK delay, the three bit field specifies increments of fifty nanoseconds for values from zero to seven. This provides a maximum delay of 350 nanoseconds of the SAM_CLK with respect to MAS_CLK, ICI_CLK1 and ICI_CLK2.

Reference Clock Generator

The reference clock generator 62 provides a means for generating fundamental operating frequency clock signals for the hardware modeling elements 16, 18. The generator produces a pulse train which specifies the operating frequency for the element at the streaming control clock sequencer 66 and device clock generator 64. Input for the reference clock generator is taken from the clock parameter registers 58 (namely, from a REF_CLK frequency register).

The reference clock generator 62 is a twelve bit counter that decrements each ten nanosecond period until zero is reached. At this time, the counter is reloaded and the counting repeated. The reloading of the counter thus provides the programmable means for providing variable frequencies.

Device Clock Generator

The device clock generator 64 provides a means for generating the hardware modeling element setup and hold time signals. The generator produces a variable duty cycle output, at the reference clock generator frequency, from the contents of the clock parameter registers 58 (namely, from a DEV_CLK setup delay register and a DEV_CLK hold delay register).

The device clock generator 64 comprises a pair of twelve bit counters that decrement each ten nanosecond period after the start of each reference clock period. The setup delay passes first, delaying the leading edge of DEV_CLK behind the reference clock. This is followed by the hold delay count, delaying the falling edge of DEV_CLK. Both setup and hold delay counts expire within the reference clock generator period. This provides a means for varying the edge placement of the DEV_CLK signals clock with reference to the stimulus being delivered to the device (See FIG. 3).

Streaming Control Clock Sequencer

The streaming control clock sequencer 66 comprises a means for moving the hardware modelling element stimulus from operating memory 28 to the IC interface circuit 30 and to the input/output port 32. In addition, sequencer 66 provides a means to enable the timing analysis to function and to provide for starting and stopping the streaming clocks.

The streaming control clock sequencer 66 generates the following streaming clocks:
1. OM_CLK.
2. ICL_CLK1.
3. ICL_CLK2.
4. MAS_CLK.
5. SAM_CLK.

The specific sequence of the streaming clocks is affected by the hardware modeling element IC interface board type. The sequence is adjusted to perform the required time demultiplexing of stimulus packed in operating memory. This unpacking and alignment is accomplished with OM_CLK, ICL_CLK1, ICL_CLK2 and MAS_CLK.

IC interface boards 30 for hardware modeling elements having 64 and 128 pins may receive their stimulus at any one instant on the VEC_DAT bus, since that bus is 256 bits wide. FIG. 18 shows an exemplary 64/128 pin four vector transfer. The REF_CLK signal in FIG. 18 is the internal clock circuit signal, generated by reference clock generator 62, which drives the streaming clock sequencer circuit 66. STREAM_GO is the assertion of the "go" bit, referenced in the discussion of the control circuit above, which starts the clock circuit 56. The vector counter signal is the signal from vector counter 75 which indicates the number of vectors, that still need to be transferred from the operating memory 28. Vector counter 75 is decremented with each OM_CLK pulse. When the vector counter signal reaches zero, the "finished" flag, described above in connection with the control circuit is set and the simulation is ended.

Operation of the interface board 30 for hardware modeling elements with more than 128 pins is somewhat more complex. In the case of a 256 pin device, the 512 bits of stimulus are supplied with two transfers on the VEC_DAT bus. Therefore, two transfers are performed on VEC_DAT using OM_CLK for both. ICL_CLK1 captures the first vector, ICL_CLK2 captures the second and MAS_CLK simultaneously applies the stimulus to the hardware modeling element device. See FIG. 19 for a 256 pin format four vector (two double vector) transfer.

The streaming control clock sequencer 66 also provides means for pipelining the stimulus. The pipes are required to provide the extremely short stimulus period of 60 nanoseconds. When moving stimulus from operating memory 28 to the hardware modeling element, a minimum of three pipe stages exist. They are:
1. Pass vector address to operating memory.
2. RAM access of the stimulus vector.
3. Pass vector stimulus data to IC interface circuit.

All three stages are totally overlapped to provide the minimum vector cycle time (60 nanoseconds).

In addition to providing stimulus movement control, the streaming control clock sequencer 66 also provides the stimulus response capture pulse SAM_CLK. This timing pulse is generated after the application of all stimulus to the device.

The control clock sequencer 66 also provides start and stop information to timing analyzer and memory 34 for enabling its analysis of hardware modeling element timing behavior. This start and stop information is provided through an enable timing analysis line (not shown) connecting sequencer 66 and timing analyzer and memory 34.

Streaming Clock Time Alignment Circuit

Streaming clock time alignment circuit 68 provides a means for compensating for standard component tolerances, allowing variable amounts of settling time for device response capture, and for providing increased resolution and accuracy during timing analysis.

Time alignment is provided for four of the eight stream clocks described above: OM_CLK, SAM_CLK, CLK25PH0 and CLK25PH1.

For the case of component tolerance, operating memory clock (OM_CLK) is aligned by adding delay with respect to the capturing of stimulus at the gate array (described below). Differences in component propagation time, from the operating memory board 28, to a gate array output register, can be compensated from system to system. Compensation insures reliability and system performance.

For the case of device settling time, sample clock (SAM_CLK) is aligned by adding delay with respect to the last applied stimulus to the device. Doing so allows variable amounts of time, as required, for the device to drive or release its outputs. This process guarantees that hardware modeling element capacitive effects will not corrupt logical state readings.

For the case of timing analysis resolution and accuracy, timing memory clocks (CLK25PH0 and CLK25PH1) are delayed synchronously with respect to MAS_CLK, ICL_CLK1 and ICL_CLK2. Doing so enables calculation or measurement of wavefront propagation delays among pins of the hardware modeling element device with better granularity than available at the operating frequency of control circuit 24. In addition, this provides a means for determining the delay added by a hardware modeling element.

Access and DMA Control

The Access and Direct Memory Access (DMA) control circuit 74 provides the control circuit 24 with a means for passing message and data between workstation 14 and user memory 26. In addition, it provides a means for directly transferring hardware modeling element stimulus between user memory 26 and operating memory 28.

The Access and DMA control circuit 74 responds to requests from the Multibus adapter 36 to complete transfers to or from user memory 26, and responds to requests from the microprocessor 70 to DMA stimulus from user memory 26 to operating memory 28.

The control circuit 74 operates in one of three modes according to the current state of an evaluation. The state sequence of an evaluation is as follows:
1. System Mode—hardware modeling circuit 10 is idle or processing evaluation data.
2. DMA Mode—hardware modeling circuit 10 is transferring stimulus data from user memory to operating memory.
3. Stream Mode—hardware modeling circuit 10 is applying stimulus or capturing evaluation results.

At the completion of stream mode, the microprocessor 70 returns the hardware modeling circuit 10 to the system mode.

Access to user memory 26 from the workstation 14 is permitted in all three modes. However, in the DMA mode, transfers from user memory 26 to operating memory 28 are temporarily suspended until the workstation access is completed. Furthermore, any workstation access to the user memory 26 suspends microprocessor activity until the access is completed.

Integrated Circuit Interfaces

The integrated circuit interface boards 30 and input/output port 32 are designed to serve as the interface to the hardware modeling elements. In this capacity, integrated circuit interface boards 30 and input/output port 32 save several functions. They convert the input test data into hardware stimulus signals; apply these stimulus signals to the hardware modeling elements 16, 18; retrieve output signals from the hardware modeling elements 16, 18; and convert these signals into resultant test data. For simplicity, only interface boards 30 are described. Operation of input/output port 32 is analogous.

Each integrated circuit interface 30 has the necessary interface electronics to properly drive the stimulus signals into the hardware modeling elements 16 and sense the resulting state information generated. The illustrated hardware modeling system requires a minimum of one integrated circuit interface board 30 (ICIF), with each hardware modeling circuit 10 having a maximum capacity of eight ICIF boards. The following discussion describes the ICIF boards 30 in greater detail.

The following definitions are useful in understanding the descriptions below:

HME—Hardware modeling element, as previously explained.
Word—Refers to sixteen bits of data. Used in describing data transfers among operating memory 28, user memory 26 and control circuit 24.
Bit-slice—refers to a subset of a data control device that operates on one bit of data at one time.
Block—refers to a subset of a data control device that operates on four words, or 64 bits of data at one time.
Vector—refers to 256 bits of data. Used to describe quantities of simulation data transferred from operating memory 28 to ICIFs 30.
Half-vector—128 bits of data.
SYS_DAT—a 16-bit bidirectional data bus (38 in FIG. 1).
SYS_ADD—a 24-bit address bus (40 in FIG. 1). Used to access different functions on the ICIF control board. Addresses originate on the control circuit 24 from either the microprocessor 70 or the dedicated DMA hardware 74.
READ—Signal sent on the system control bus 42 (SYS_CTRL) to control ICIF accesses for transfer of data out of ICIF output registers to the SYS_DAT bus 38, or to the TIM BUS 52 (FIG. 1) if timing analysis is employed.
WRITE—Signal sent on the system control bus 42, which controls ICIF accesses for transfer of data into input registers of the ICIF gate arrays from the SYS DAT bus 38.
VEC_DAT—256-bit unidirectional data bus 50 (FIG. 1) used to stream data vectors from operating memory 28 to the ICIF 30. This bus originates on the operating memory and supplies 256 bits of data to each of the eight ICIF board slots.
DEV_CLK, MAS_CLK, ICI_CLK1, ICI_CLK2 and SAM_CLK (described above) are the stream clocks coming into the ICIF 30 and constitute control signals used to provide proper timing and control functions to the gate arrays of the ICIF and hardware modeling element drive components.
TM_DATA or TIM BUS—a 64-bit unidirectional data bus 52 used to send hardware modeling element response data to the timing analyzer and memory 34.
PULL_HI/LOW (or PULL, BPULL)—a one bit control signal that is used to control an enable for performing high impedance testing on output pins of a hardware modeling element device under test.
RST—the system reset control for the entire ICIF board. It places the entire ICIF board into a known initial state when activated.

Note that buffered versions of a signal are prefaced by the letter "B." Thus, BPULL is the same logical signal as PULL, but has been conditioned by a buffering stage. As another bus naming convention, it should be recognized that an asterisk after a bus name indicates a signal that activates by changing from a logic 1 state to a logic 0 state. Thus, RST* would be an inverted version of the RST signal The ICIF 30 responds to addresses on the SYS_ADD bus 40 in the range of F80000 to F8FFFF Hexidecimal notation]. Each ICIF is also capable of determining which slot on the back plane of the hardware modeling circuit it occupies, thus relieving the user of having to program ICIF slot-use information.

The ICIF has two modes of operation, a system mode and a streaming mode.

Figure 9:
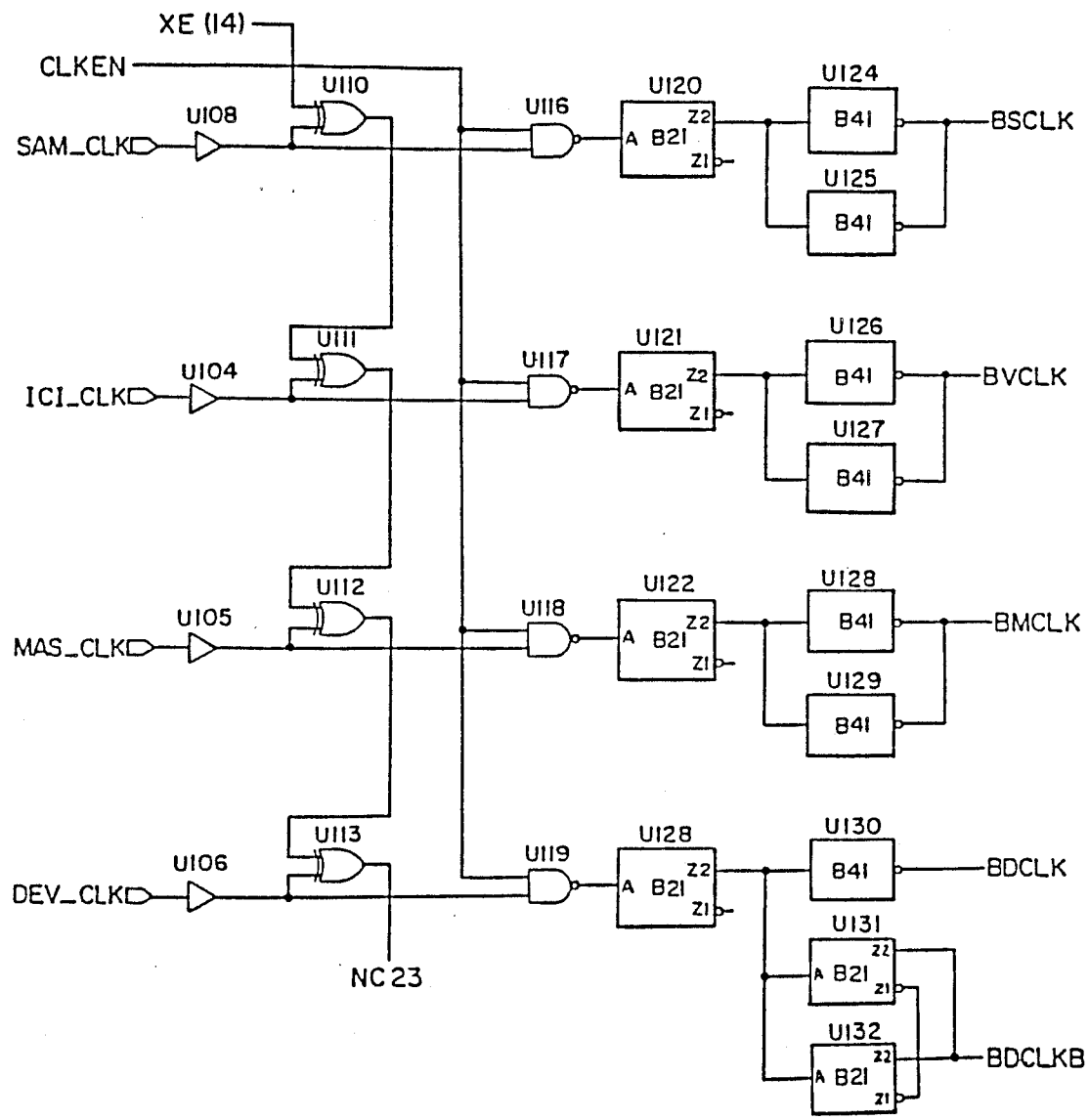
FIG. 9 is an electrical circuit schematic diagram of still another portion of the integrated circuit interface of FIG. 1.
Figure 10:
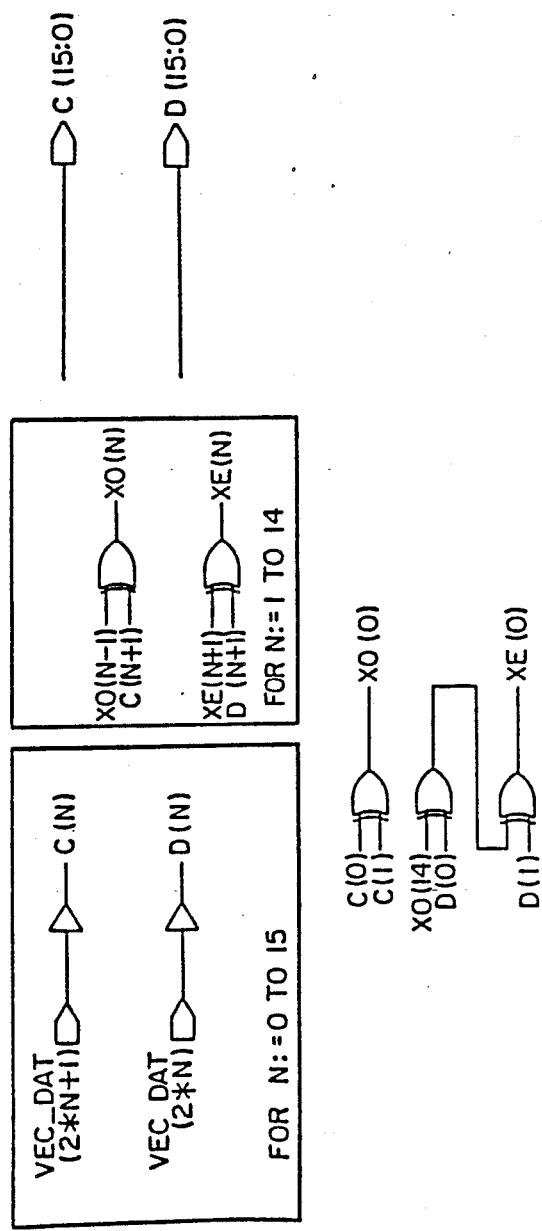
FIG. 10 is an electrical circuit schematic diagram of a further portion of the integrated circuit interface of FIG. 1.

1. System Mode—This mode allows the ICIF to be pre-programmed with the specific pinout and mode of operation for the hardware modeling element to be tested. This mode actually has several sub-modes that aid in programming the ICIF 30 to correctly handle the hardware modeling element under consideration. These sub-modes are as follows:

a. Set-up Mode Registers—This sub-mode allows the signals CLKEN, PPOL, NPOL and BPM to be latched into the ICIF's Mode Register. These signals serve the following functions: CLKEN is the master clock enable signal. This signal enables or disables all stream clock signals sent to the ICIF board 30 (CLKEN appears in FIGS. 7 and 9). PPOL, and its inverse NPOL, determine whether pulses sent in pulse mode are to be positive or negative (PPOL and NPOL also appear in FIGS. 7 and 9). BPM signals the ICIF 30 to operate in pulse mode (BPM appears in FIGS. 7 and 9).
   b. Set-up Clocked Pin Functions—This sub-mode allows data on the SYS_DAT bus 38 to be written into the ICIF's internal clocking registers to program which pins on the hardware modeling element 16 are to be clocked.
   c. Read-Mode—This sub-mode allows the ICIF 30 to retrieve data out of the ICIF's output registers via the SYS_DAT bus 38.
   d. Timing-Analysis Mode—This sub-mode allows the timing analyzer and memory 34 to access the output data from pins of the hardware modeling element 16 being tested.

2. Streaming Mode—This mode allows the control circuit 24 to control the streaming of data vectors from the operating memory 28 to the ICIF 30. Vectors and half-vectors are transferred over the VEC DAT bus 50.

When in the system mode, the ICIF 30 will be involved only with tasks that deal with pre-stream mode setup, and post-stream data retrieval. All functions performed by the ICIF board 30 are controlled by the control circuit 24, and hence the ICIF is basically a slave. The manner in which the ICIF is controlled depends on commands given to the ICIF via the SYS_ADD bus 40, and write and read signals on SYS_CTRL bus 42. An examination of the ICIF addressing scheme is in order.

| xxxx | xxxx | xxxx | xxxx | xxxx | xxxx |
|------|------|------|------|------|------|
| F MSB | 8 | (slot-id) | | (mode) | (block/word) LSB |

The ICIF board 30 is provided a total of 24 address lines, indicated by X's above. In this arrangement, the first eight lines are used as the board select address, which in this case is the number F8(hex). The next four lines are used for slot-id addresses, which differentiate among the different ICIF boards housed in the same system, each board having an independent slot-id address. The next four lines are unused. The next four lines are used to indicate mode-register setup. Finally, the last four lines are used to select the gate-array block (FIG. 4), as explained below, and the word being operated on.

The illustrated ICIF 30 uses two data formats, a sixty-four pin format and a one hundred twenty-eight/two hundred fifty-six pin format, as follows:

64 Pin Format—In this format, a 128 bit half vector is driven onto either the high, low, or both halves of the VEC_DAT bus 50. This allows simulation evaluations on a hardware modeling element with up to 64 pins. Low and high half-vectors can be transferred from the operating memory 28 in consecutive memory cycles. In this format, 64 bits of the 128 bit half-vector are data information, and the other 64 bits are used for tri-state control on the gate array, as explained below.

128/256 Pin Format—In this format, 256 bit data vectors are driven onto the VEC_DAT bus 50. This allows the simulation evaluation of a hardware modeling element having up to 128 pins. By using consecutive vector locations, a 256 pin hardware modeling element can be evaluated. Control circuit 24 controls these modes.

Figure 4:
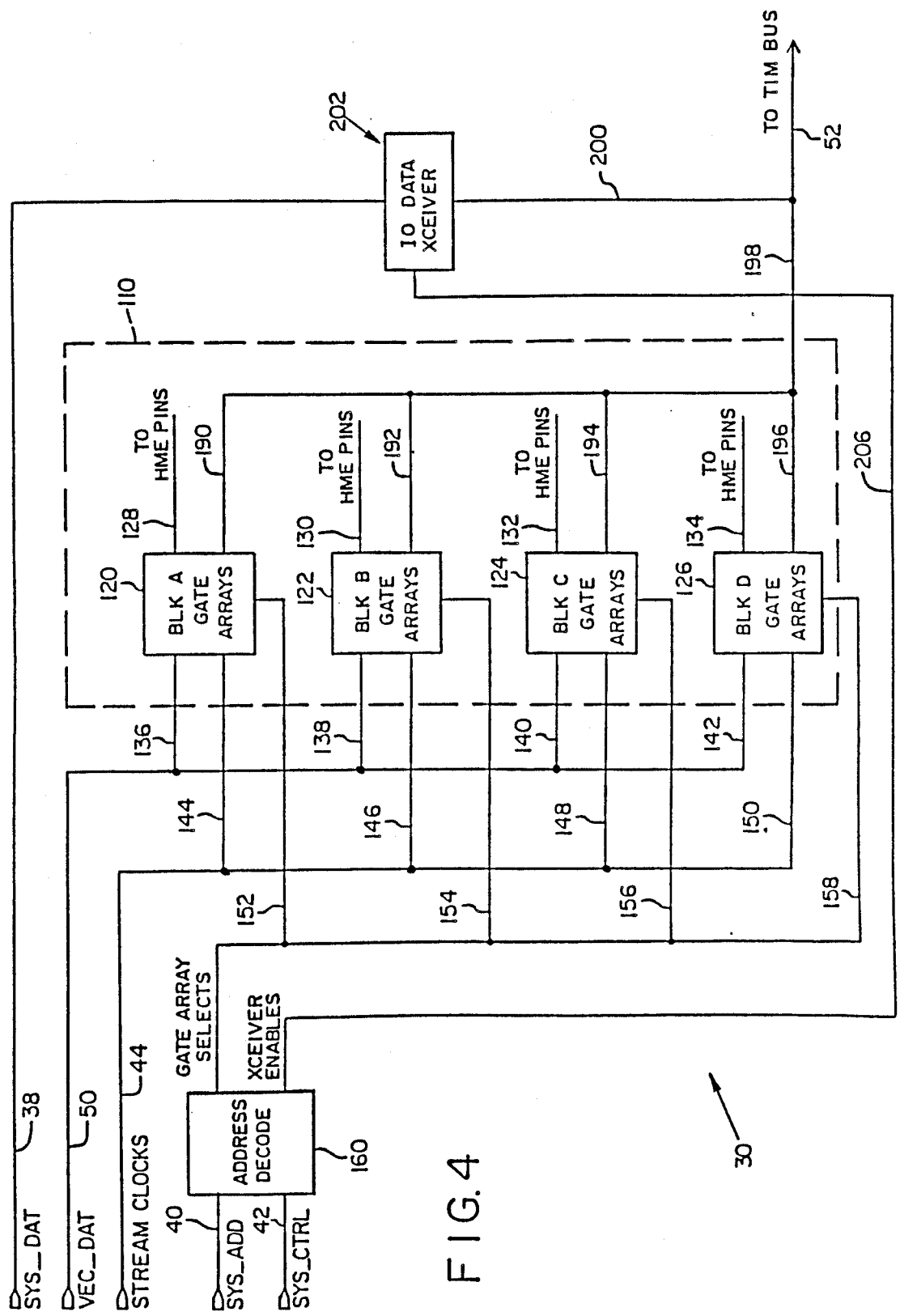
FIG. 4 is a schematic block diagram of plural gate arrays utilized in the integrated circuit interfaces of the hardware modeling circuit of FIG. 1.

The ICIF 30 operates generally as follows:

A single ICIF board 30 is designed to accommodate one of almost any type of hardware modeling element with up to 256 pins. The bussing architecture is shown in FIG. 4 and clarifies the general layout of the ICIF board 30. Note the four gate array blocks 120, 122, 124 and 126 which are included in a gate array 110. These blocks are groups of gate array devices designed to process vector data for an associated ICIF. Each block accepts 128 data and drive control lines, has 128 data input/outputs, 64 data outputs and a number of control lines.

Each of the four blocks 120-126 has independent control lines, making it possible to run evaluations on four different hardware modeling elements at different times, given that each hardware modeling element under evaluation has no more than 64 pins. Hardware modeling elements with more than 64 pins require cascading of additional blocks, with each added block adding an additional capacity of 64 pins. Thus, the inclusion of four gate array blocks 120-124 provides each ICIF board 30 with the capability of running a hardware modeling element with up to 256 pins.

Figure 5:
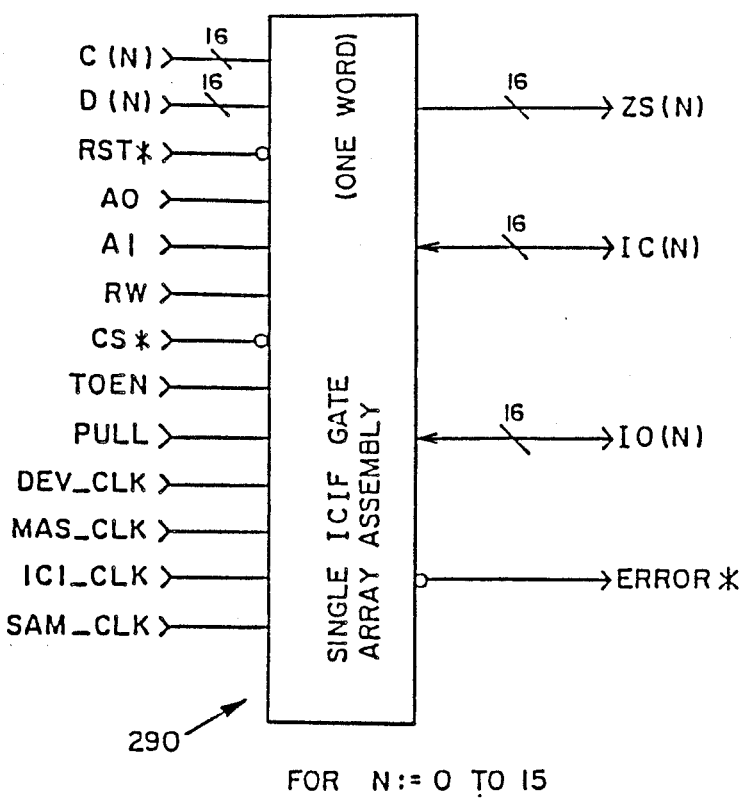
FIG. 5 is a block diagram of a single integrated circuit interface gate array assembly.
Figure 11:
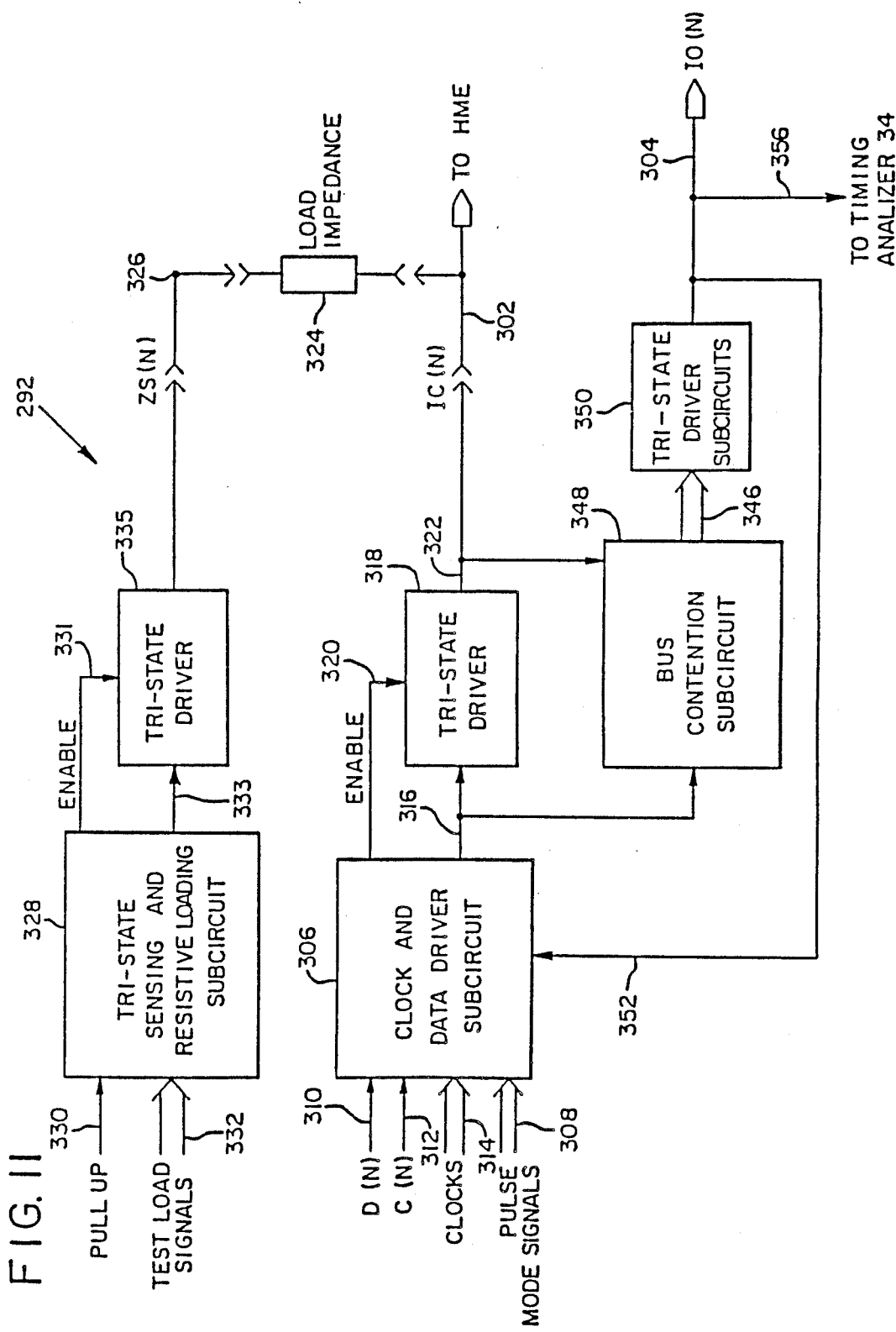
FIG. 11 is a block diagram of a single gate array circuit utilized to deliver signals to and receive signals from a single pin of a hardware modeling element.
Figure 12:
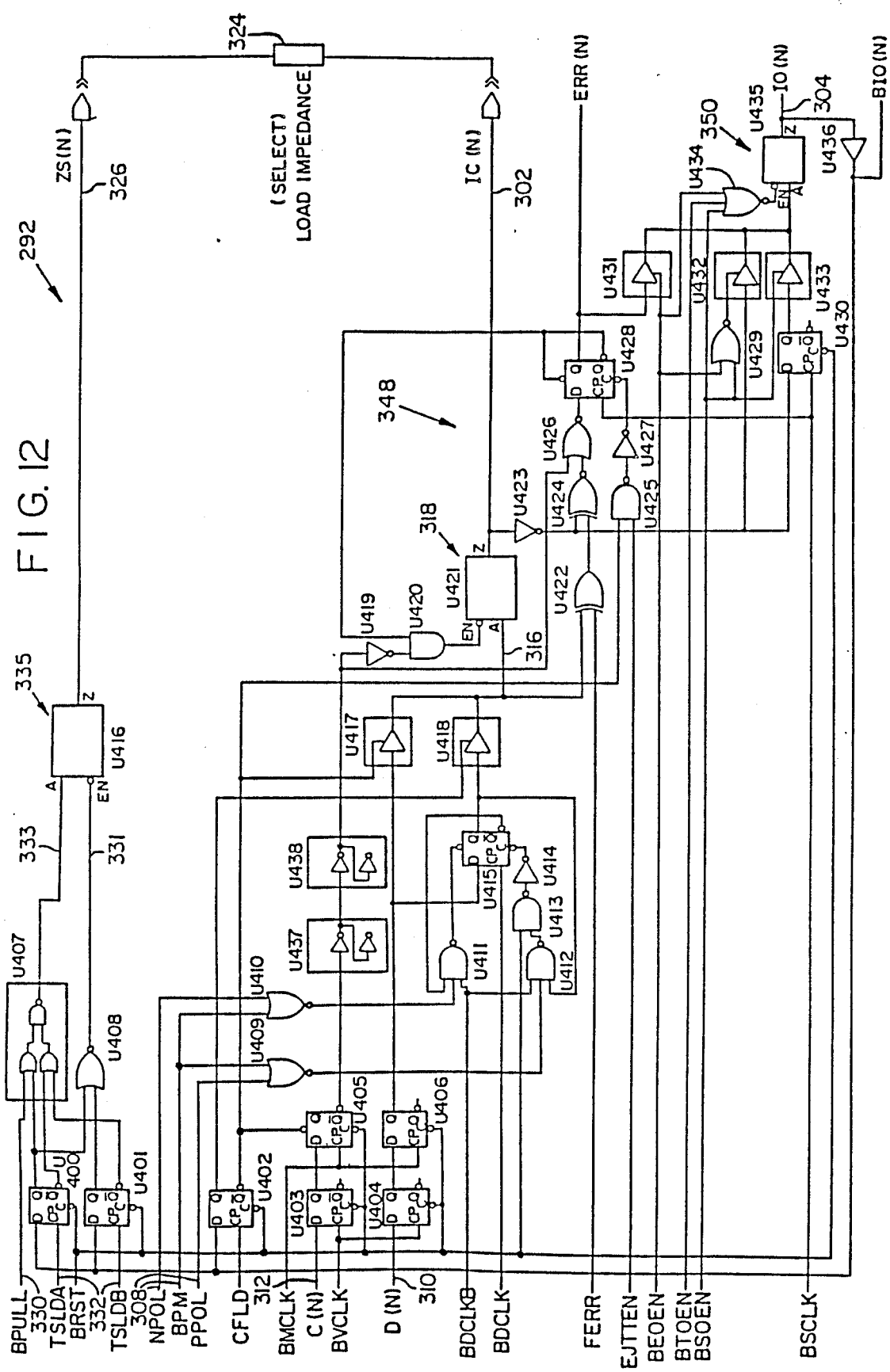
FIG. 12 is an electrical circuit schematic diagram of a gate array circuit which accesses one pin of a hardware modeling element.

More specifically, each gate array block 120-126 includes four gate array circuit assemblies 290 (FIG. 5), each such circuit assembly being capable of accessing, stimulating and monitoring sixteen pins of the hardware modeling element via respective lines 128-134 (FIG. 4). Furthermore, each gate array circuit assembly 290 comprises a subassembly of sixteen single pin accessing circuits 292. One such circuit 292 is shown in FIGS. 11 and 12 and is described below in connection with FIGS. 11-17.

The gate array blocks 120-126 are connected by lines 136-142 (FIG. 4) to VEC_DAT bus 50 and by lines 144-150 to the STREAM CLOCKS bus 44 for receiving clocking signals from the control circuit 24. In addition, lines 152-158 couple the gate array blocks to an address decode circuit 160 of the ICIF 30. Circuit 160 transmits signals along these latter lines to the appropriate gate array assemblies 290 to access the hardware modeling element needed for modeling. Output lines 190-196 are provided for delivering output signals from the hardware modeling elements within gate array blocks 120-126 to an output bus 198, and then to timing bus 52 and to the timing analyzer and memory 34 in the event time analysis is employed. Alternately, if timing analysis is not used, output data is transmitted along output bus 200 through an enabled transceiver circuit 202 to the SYS_DAT bus 38 and then back to a user's workstation 14. Transceiver circuit 202 is enabled by signals on lines 206 from address decode circuit 160.

The logic of address decode circuit 160 is straight forward and will not be described in detail. However, in general, circuit 160 includes a bank of comparators that compare slot-id, board-id, block-id, word-id, as well as perform function select. Logic gates are used to select different functions for setup, streaming, and readout modes on the gate array 110. Decoders are employed to perform block and word select. Flip-flops are used to latch mode register data for gate array control functions. Address decode circuit 160 also provides enables for determining if timing analysis is used.

The tasks of the address decode circuit 160 are to set up the ICIF board 30 to conform to the pin definitions of the hardware modeling element under test; to provide control signals for the extraction of resultant data output from the hardware modeling element during timing analysis, reading output pins, and high impedance sensing (as explained below); and to provide signals indicating that the hardware modeling system 10 has a potentially damaging fault, such as when a bus contention occurs on a data line. The manner in which the ICIF 30 performs these tasks is directly linked to the operation of the gate array devices which are used in each ICIF block and which are described below.

Gate Array

FIG. 11 is a block diagram of a single gate array circuit 292 of the IC interface (ICIF) 30. One gate array circuit 292 is preferably connected to each input and output conductor/pin of the hardware modeling element under evaluation. The gate array circuit 292 is operable selectively to apply either a drive signal to an input conductor or to receive a signal from an output conductor of the hardware modeling element. Each gate array circuit 292 is capable of delivering either a clock signal or a data signal to a hardware modeling element input conductor, changing the load impedance presented to an hardware modeling element output conductor, and detecting a bus contention. A bus contention occurs whenever both the gate array circuit and the hardware modeling element coincidentally apply drive signals to the same conductor. Gate array circuit 292 also can deliver the signal from the corresponding hardware modeling element output terminal to the timing analyzer and memory circuit 34 (FIG. 1). The timing analyzer and memory samples the signal every 10 nanoseconds to develop an accurate representation of its timing characteristics.

With reference to FIGS. 11 and 12, gate array circuit 292 operates either to apply a drive signal to, or to receive an output signal from, the hardware modeling element on an IC(N) terminal 302. A drive signal is a digital signal with transitions between the "strong logic 0 state" and the "strong logic 1 state." Gate array circuit 292 receives output signals from the hardware modeling element only when the output of the gate array circuit is in the high-impedance state. The vector data bus 50 provides the signals to change the operating modes of the gate array circuit.

A first important function of the gate array circuit 292 is to provide drive signals to the hardware modeling element. Whenever control circuit 24 commands gate array circuit 292 to provide a clock signal to the pin of the hardware modeling element to which circuit 292 is connected, the control circuit delivers a signal to an IO(N) terminal 304. This signal enables a clock and data driver subcircuit 306 to provide clock signals of the desired character to IC(N) terminal 302. The clock signal can be of either pulsed or single edged character. The control circuit 24 provides pulse mode signals to an input 308 of subcircuit 306 to develop clock signals of the desired kind. The pulse mode signals also dictate the sense of the transitions between logic states of the pulsed clock signals so that they properly drive both negative-edge and positive-edge triggered inputs of the hardware modeling element. The pulse mode signals 308 of FIG. 11 comprise the BPM, PPOL and NPOL signals of FIG. 12.

The control circuit 24 applies the vector data signals to a D(N) input 310 and the vector output enable control signals to a C(N) input 312. In the clock mode, a C(N) signal does not affect the operation of drive subcircuit 306. The control circuit 24 applies a plurality of clock signals to inputs 314 of drive subcircuit 306 in the proper time sequence to present the clock pulses at an output 316 of drive subcircuit 306 and deliver them to the associated pin of the hardware modeling element 16 at the desired time.

Whenever control circuit 24 commands gate array circuit 292 to provide a data signal to the hardware modeling element, the control circuit delivers a signal to the IO(N) terminal 304 which enables drive subcircuit 306 to provide data signals of the desired character to IC(N) terminal 302. The serial stream of vector data applied to D(N) input 310 appears at output 316 of drive subcircuit 306 in response to the timing of the clock signals applied to input 314.

The clock signals applied to input 314 in FIG. 11 comprise the signals labeled BMCLK, BVCLK, BDCLKB, BDCLK and BSCLK in FIG. 12. These signals are derived from the MAS_CLK, ICI_CLK1, ICI_CLK2, DEV_CLK and SAM_CLK clock signals by the circuit of FIG. 9.

During either the clock mode or the data mode, a tri-state driver 318 receives, at its input 320, an enable signal from drive subcircuit 306 which causes the signals developed at its output 322 to appear at IC(N) terminal 302.

A second important function of the gate array circuit 292 is to receive signals from the hardware modeling element 16 which are then routed to the workstation software for analysis. To accomplish this task, the gate array circuit 292 is operable to apply a selectable load impedance 324 to IC(N) terminal 302. This feature is desirable when the output conductor of the hardware modeling element connected to IC(N) terminal 302 is, for example, an open collector or open emitter output. The load impedance 324 is physically connected between IC(N) terminal 302 and a ZS(N) terminal 326 and is electrically connected to gate array circuit 292 in the following manner.

A tri-state sensing and resistive loading subcircuit 328 receives a pull-up signal at its input 330 and receives test load signals at its inputs 332 (TSLDA and TSLDB in FIG. 12). The signals applied to inputs 330 and 332 drive ZS(N) terminal 326 to one of three states. In particular, whenever the signals applied to inputs 330 and 332 cause subcircuit 328 to deliver an enable signal to its enable output line 331, a tri-state driver 335 drives either the "logic 0 state" or the "logic 1 state" to ZS(N) terminal 326. The state of tri-state driver 335 follows the logic state of the signal applied to its input 333. Under these conditions, the signal applied to C(N) input 312 of drive subcircuit 306 disables tri-state driver 318 to provide a high-impedance condition at its output 322. The logic 0 and logic 1 states, therefore, provide logic voltage levels through a series impedance of the user's choice. Typically, 2.7 kilohms is used as the series impedance in the illustrated embodiment. Such resistors are preferably configured in single-inline packages of ten or more resistors to conserve space. In addition, the signals applied to inputs 330 and 332 of subcircuit 328 can selectively disable tri-state driver 335 to provide a high-impedance state at ZS(N) terminal 326.

With the above-described capability, gate array circuit 292 can be operated to test whether a high-impedance condition exists at IC(N) terminal 302. To perform this test, the output 322 of tri-state driver 318 is disabled to the high-impedance state, and a logic 0 state and a logic 1 state are sequentially applied to ZS(N) terminal 326. If IC(N) terminal 302 is at high impedance, the logic states applied to ZS(N) terminal 326 will appear at IC(N) terminal 302. The gate array circuit 292 is configured so that the signals appearing at IC(N) terminal 302 appear at IO(N) terminal 304. The signals appearing at IO(N) terminal 304 are examined by software to determine whether a logic 0 state and a logic 1 state appeared at IC(N) terminal 302 when a logic 0 state and a logic 1 state, respectively, were applied to ZS(N) terminal 326. If there exists a match between the driven and measured logic states, a high-impedance state is known to exist at IC(N) terminal 302.

To protect the hardware from destruction, the gate array circuit 292 is operable to determine whether a signal appearing at output 322 of driver 318 appears concurrently at IC(N) terminal 302 with a signal applied by the hardware modeling element. Bus contention subcircuit 348 accomplishes this task by comparing the signals appearing at the output 316 of subcircuit 306 with the signals appearing at the output 322 of tri-state driver 318 to determine whether they correspond. Whenever a discrepancy exists between the two signals, the bus contention subcircuit 348 develops at its output 346 an error signal that is delivered through tri-state driver subcircuits 350 to input 352 of drive subcircuit 306, thereby disabling tri-state driver 318 to its high-impedance state. Commanding tri-state driver 318 to the high-impedance state prevents destruction of circuitry in either the hardware modeling element or the ICIF circuit. The error signal also appears at IO(N) terminal 304 and is delivered for display to the user who can reconfigure the control signals to the gate array to correct the problem.

The signal appearing at IC(N) terminal 302 is also routed through bus contention subcircuit 348 and tri-state drivers 350 to the timing analyzer and memory circuit 34. Timing analyzer and memory circuit 34 performs a waveform analysis on signals appearing at IC(N) terminal 302, irrespective of their origins. These signals are delivered on a line 356 from the gate array circuit (FIG. 11) to timing analyzer and memory circuit 34. The timing analyzer and memory circuit includes a 1024 bit RAM memory for each pin of the hardware modeling element being sampled. The RAM memory is written at a 100 MHz clock rate, thereby inscribing the logic state of the IC(N) terminal in memory at each 10 nanoseconds interval. A 10 microsecond window of information about the signal appearing at IC(N) terminal 302 can thus be stored. The information stored in timing analyzer and memory circuit 34 is available for readout and display to the user who can then determine the exact timing sequence of the signal applied to or received by IC(N) terminal 302.

Operation of the ICIF Gate Array

The internal layout of a single ICIF gate array assembly 290 (FIG. 5), indicates that there are 11 control inputs, 32 data inputs, 16 data outputs, and 32 I/O data pins. The functions of the control and data signals for the ICIF gate array assembly 290 are as follows:

1. C(N)—data input lines used to control the drive strength of the IC(N) lines.
2. D(N)—data input lines used to transfer data to the inputs of the IC being evaluated.
3. RST*—system reset control input places all resettable registers in known state (shown also in FIG. 7).
4. A0 and A1—address control input lines used to set up functions in the gate array before a simulation run (shown also in FIG. 8). The two bits from these lines can indicate one of four functions: load the mode register, load the clock enable register, and load the two different tri-state control registers. Registers in the ICIF gate array 110 are found as single bit storage blocks in the schematic of the single gate array device in FIG. 12. For example, the two tri-state control registers are blocks U400 and U401 driven by lines TSLDA and TSLDB respectively.
5. RW—Read (active high)/Write (active low) control input line, used to select between setup (write functions) and readout of stored output values from the IC simulation run, as well as to verify data during system testing on the gate array (shown also in FIG. 8).
6. CS*—chip select control input function determines if gate array is enabled (shown also in FIG. 8).
7. TOEN (or BTOEN)—timing analyzer output enable determines whether the optional timing analyzer 34 is used to probe the IC under stimulus (shown also in FIGS. 6, 7 and 12).
8. PULL (or BPULL)—control input used to direct the state of the ZS(N) pins during high-impedance sensing (shown also in FIGS. 7, 11 and 12).
9. DEV CLK—device clock control input used to clock the IC under test.
10. MAS_CLK—master clock control input used to move simulation vectors between registers within the ICIF-gate array structure.
11. ICI_CLK1 and ICI_CLK2 (abbreviated ICI_CLK)—vector clock control input used to load control and data vectors into the ICIF-gate arrays input registers.
12. SAM_CLK—sample clock control input used to sample the resultant output of the IC under test by clocking the data into a register.
13. ZS(N)—data outputs used to sense tri-state output conductors on the IC under test. Resistors are placed between each ZS(N) and IC(N) pin, as discussed above.
14. IC(N)—data input/outputs used to connect to the IC under test. The gate array can treat IC(N) as an input, an output, or as a clock terminal.
15. IO(N)—data input/outputs used to provide data during setup and to provide a means of reading out sampled output data after a simulation run.
16. Error*—control output line used to show bus contention errors during streaming mode.

Figure 13:
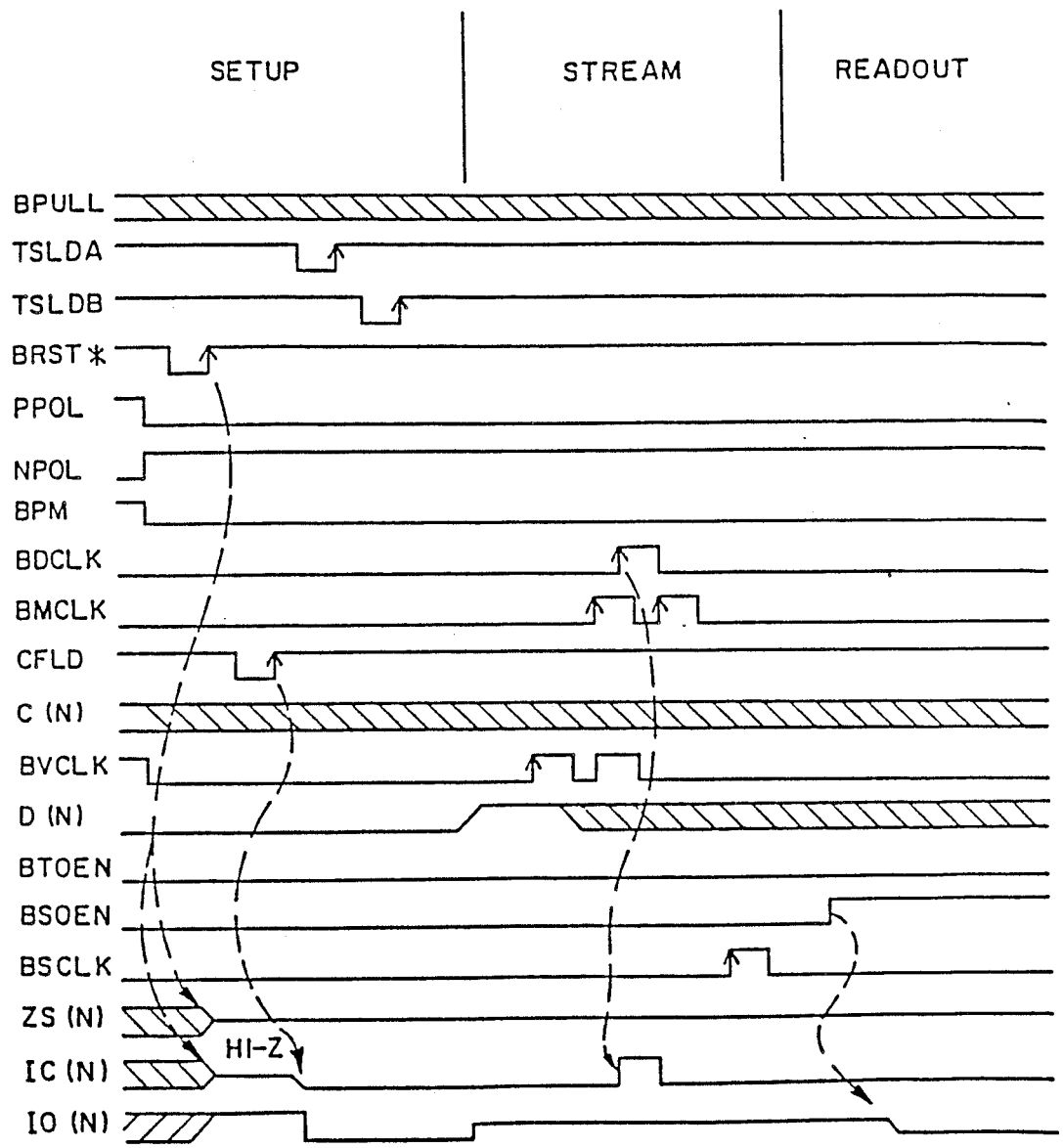
FIG. 13 is a timing diagram of signals applied to the gate array circuit of FIG. 12 when this circuit is coupled to a clock pin of a hardware modeling element (any pin of a hardware modeling element may be treated in this manner as a clock pin)
Figure 14:
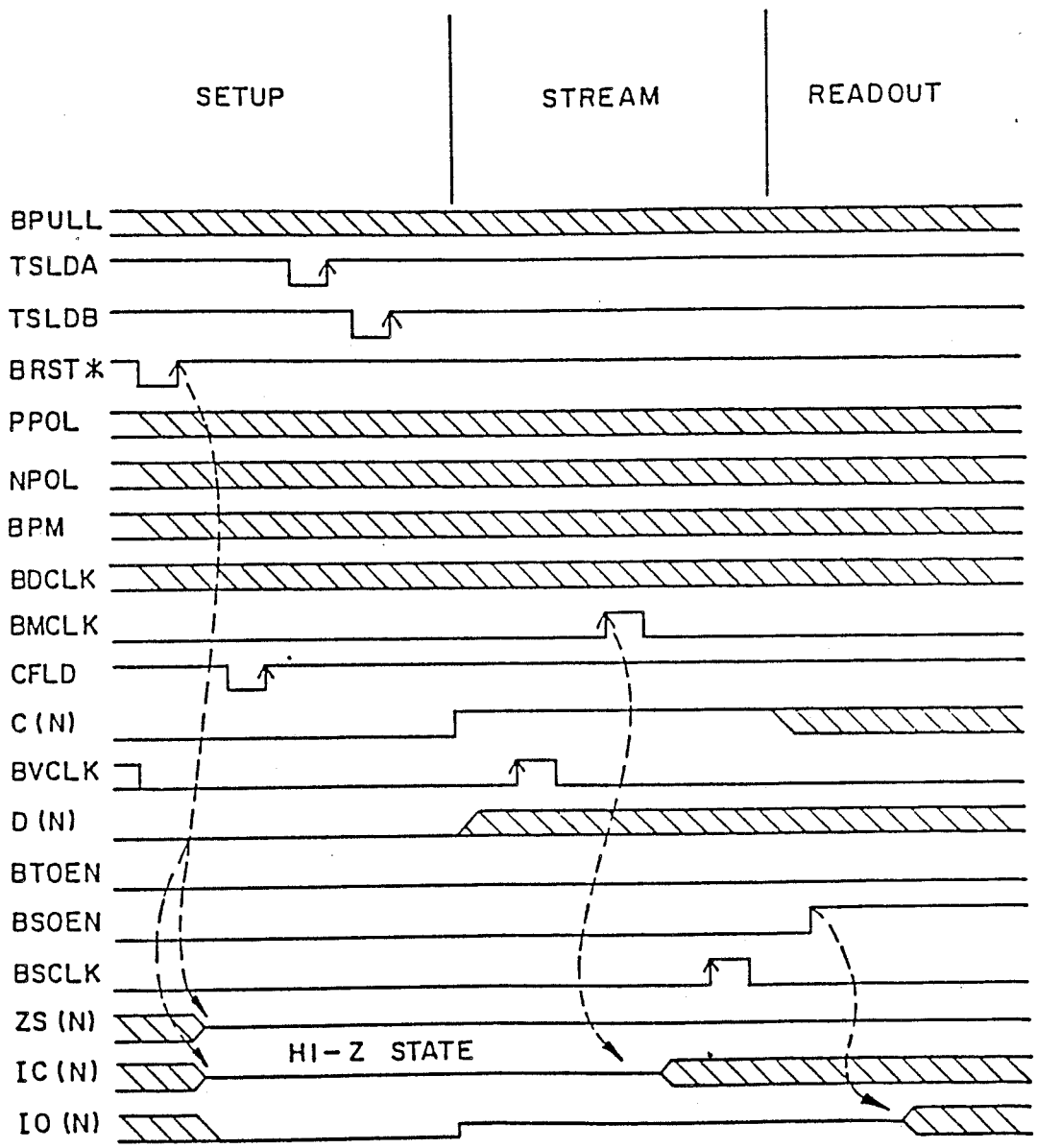
FIG. 14 is a timing diagram of signals applied to the gate array circuit of FIG. 12 during streaming of data from the operating memory of the hardware modeling circuit of FIG. 1 to the gate array circuit of FIG. 12 during evaluation.
Figure 15:
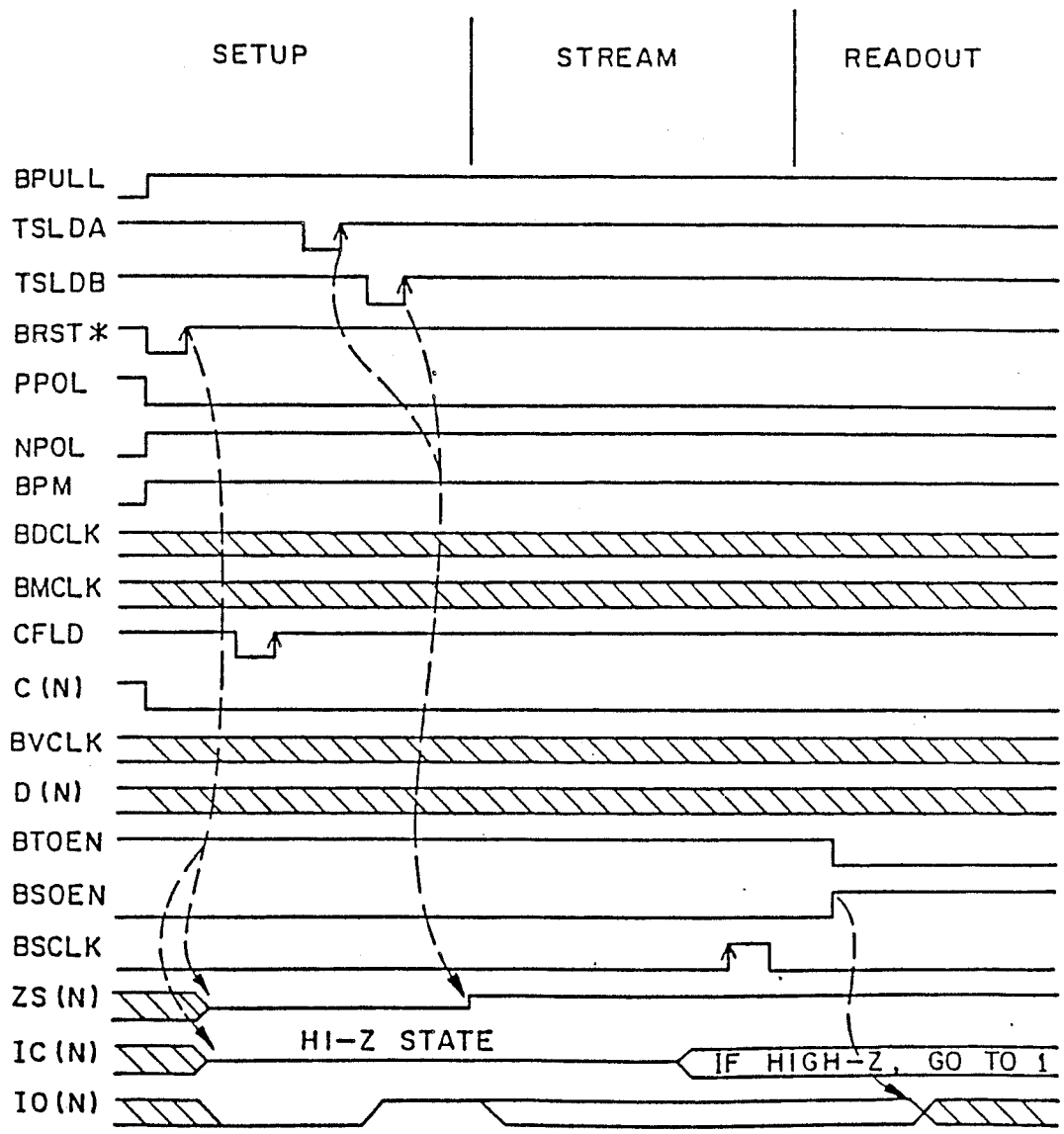
FIG. 15 is a timing diagram of signals applied to the gate array circuit of FIG. 12 during reading of resultant data from the pin accessed by this gate array circuit.

Testing an IC with known terminal characteristics and timing specifications can be accomplished as follows. The first step is to define the function of each pin on the IC, and to set up the gate array to treat it according to its definition. FIGS. 13–15 show typical timing patterns for setup before test, streaming during testing, and readout of the resulting data after the test. In all three cases, the timing diagrams only show the case for one terminal of the gate array that presents a signal to drive or that receives a signal from the respective IC input or output conductor.

FIG. 13 shows the case of the gate array operating the device pin as a clock in the positive-pulsed mode. FIG. 14 shows the case of a gate array operating the device pin as a data input, with no timing analysis and no high-impedance testing. FIG. 15 shows the case of a gate array receiving output signals from the device pin using timing analysis and tri-state testing. The procedures for the other gate array terminals would follow the same steps for setup and readout, but the data and control signals would be different.

Figure 6:
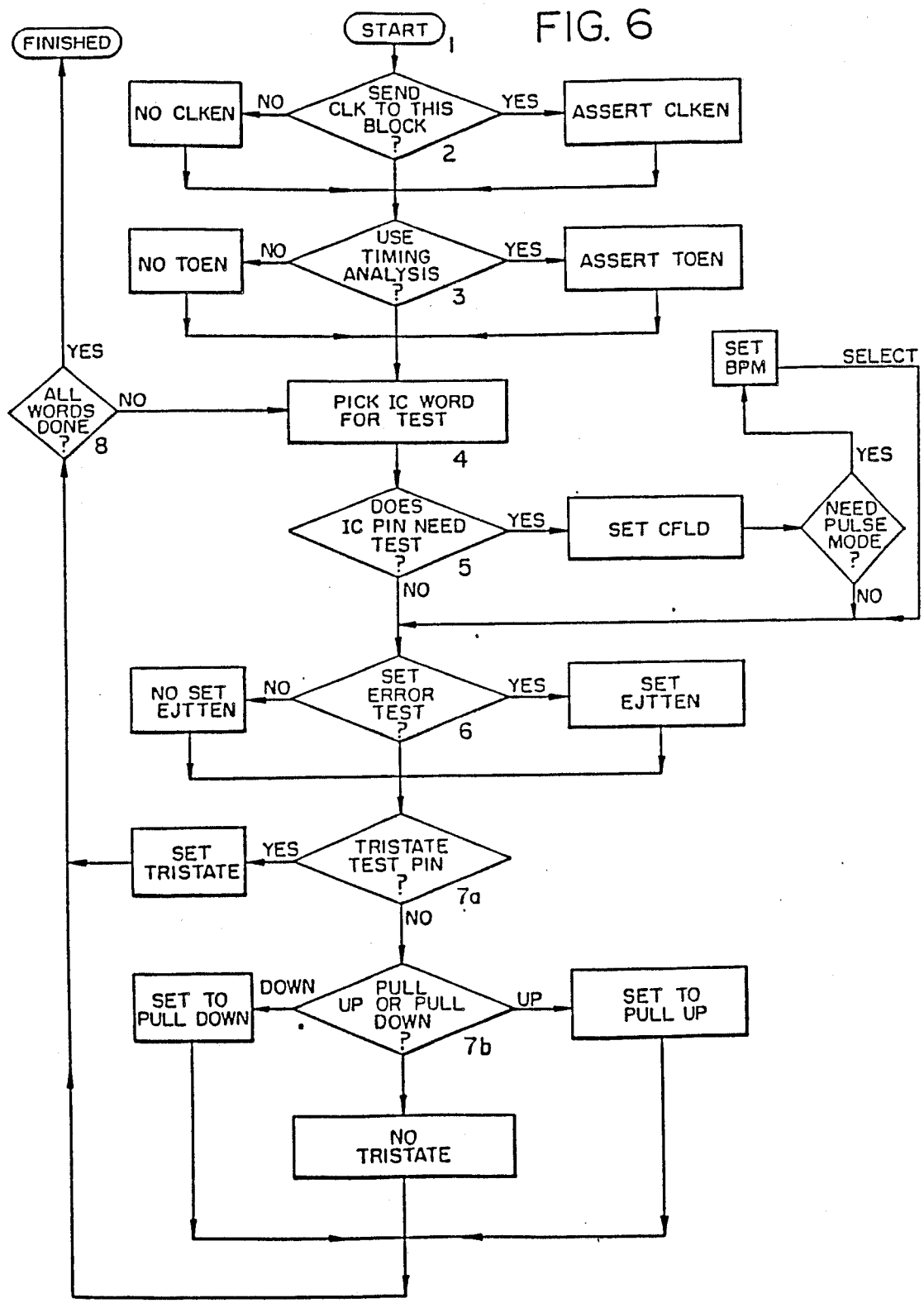
FIG. 6 is a flow chart of a program employed by the microprocessor of the control circuit of FIG. 2 to initialize an integrated circuit interface for processing data for a simulation evaluation.

FIG. 6 is a simple flowchart that defines the logic path followed by the control circuit 24 when setting up a gate array block prior to a simulation. The steps in this flowchart are further explained below:

Step 1: Start—BRST (shown in FIGS. 5 and 7) is enabled so that all the internal registers of the component gate array circuits 292 are cleared.

Step 2: Send Clocks to this Block ?—The decision is made at the block level and simply dictates whether the gate array block will receive any data during the streaming mode. If the clocks are not enabled by the CLKEN signal (discussed above with reference to the System Mode of ICIF operation and shown in FIGS. 7 and 9), then no data is transferred to that block of gate array circuits.

Step 3: Use Timing Analyzer ?—The decision is made at the block level and dictates . whether the drivers associated with that block and connected to the timing analyzer and memory 34 are enabled. Timing analysis for the block is enabled by the TOEN signal (shown in FIGS. 5, 7 and 12).

Step 4: Select IC Word for Test—One word is composed of 16 bit slices of the gate array (corresponding to one gate array circuit subassembly 290). Setup is done one word at one time, although each bit in the word is predetermined and setup separately.

The following steps are performed separately for each gate array circuit 292.

Step 5: Does IC Pin Need a Clock ?—At any given time, an IC pin is either a data input, a clock input, or a data output. If a pin is a clock pin, the gate array circuit 292 is set up to perform that function by a signal on the CFLD line (see FIGS. 8, 12).
  a. If a pin is a clock pin, it must be used in either pulse (reset after active edge) or non-pulse mode for the IC device clock.
  b. If pulse mode is used, an additional choice must be made to determine whether clock lines are reset after negative edges or positive edges of the device clock. The signals on the NPOL and PPOL lines (see FIGS. 7, 12) indicates which choice has been selected.

Step 6: Set Error Test ?—This enables or disables the bus contention error detection circuitry (348 in FIG. 11) if the user wishes to protect the hardware modeling system 10 and the IC-under-test against possible coincidental application of drive signals by them to the bus during operation. The bus contention enable signal is sent on line EJTTEN (see FIGS. 7, 12).

Step 7a, 7b Tri-State Test Pin ?—This determiners whether an output of the IC-under-test is to be treated as tri-state or whether it is to be pulled up or down.
  a. If the pin is not to be tested for high impedance, it may be necessary to treat it in a special way, (e.g., open collector outputs) such that a pull-up or a pull-down resistor is necessary.
  b. If no special treatment is necessary, and no high-impedance testing is to be run on the pin, the test driver is disabled.

This is accomplished as follows: The TSLDA and TSLDB signals (FIGS. 8, 12) load two registers which indicate how the pin under test is to be treated. The two registers provide four possible combinations corresponding to (1) always pull up; (2) always pull down; (3) be tri-state testable (that is, can be pulled dynamically high and low with the BPULL signal); or (4) float. These four options are illustrated by the blocks 7a and 7b of FIG. 6.

Step 8: All Words Done ?—If all of the words to be set up are done, the setup is completed.

Control Signals For ICIF Bit-Slice Gate Array

Figure 7:
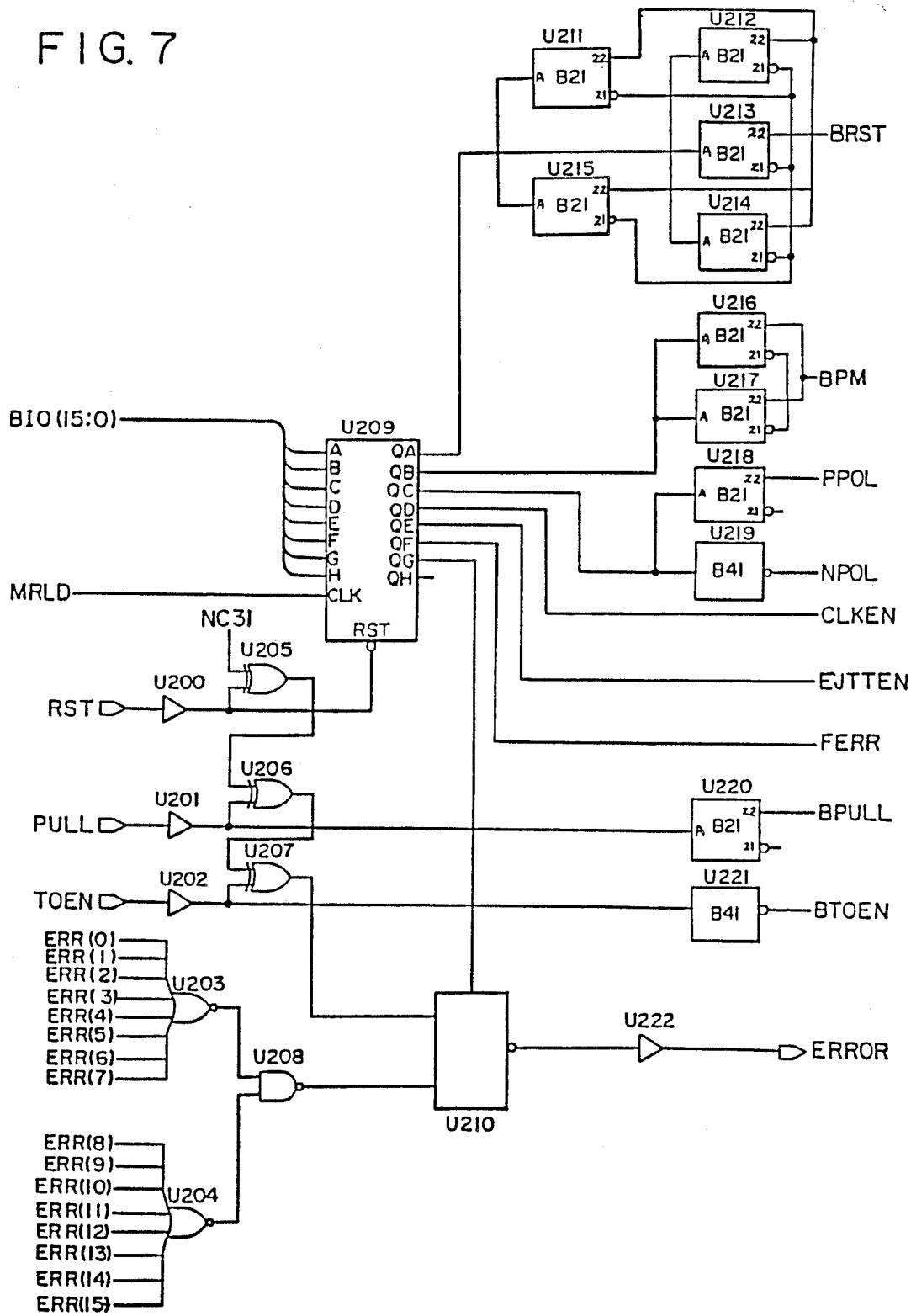
FIG. 7 is an electrical circuit schematic diagram of a portion of the integrated circuit interface of FIG. 1.
Figure 8:
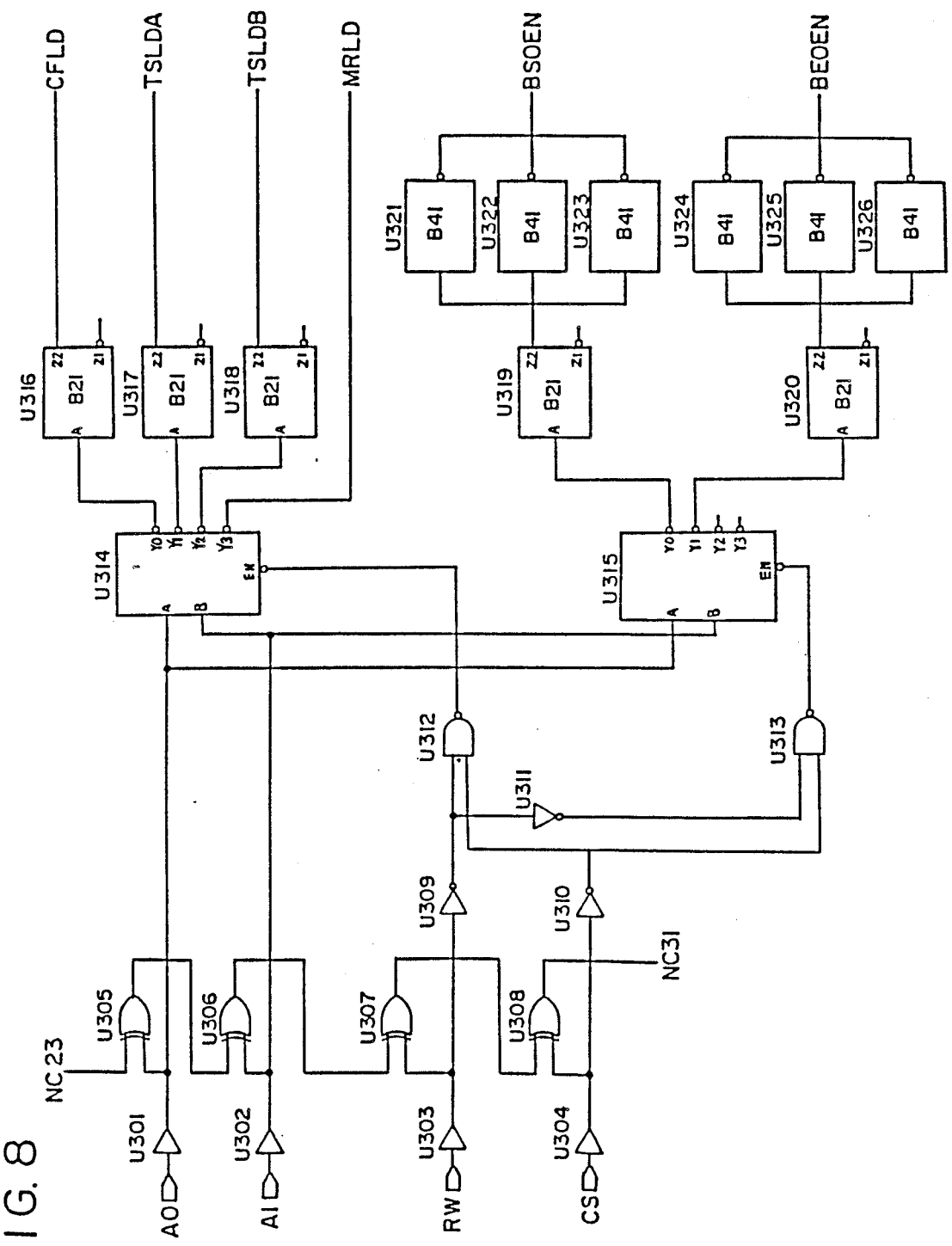
FIG. 8 is an electrical circuit schematic diagram of another portion of the integrated circuit interface of FIG. 1.

The "bit-slice" gate array circuit of FIG. 12 shows one bit of the ICIF gate array 110. (Some of the input decoding and control logic has been omitted for clarity.) The complete ICIF interface 110 is comprised of 256 bit slices (16 bit slices per subassembly 290, 4 subassemblies 290 per block 120–126; 4 blocks per complete ICIF interface 110). The control signals for an ICIF bit slice gate array 292 are identified and described below:

1. BPULL—a control line used to pull the ZS(N) output high or low during high-impedance testing (shown also in FIGS. 5 and 7).
2. TSLDA & TSLDB—Tri-State Load A & B are used to control the operation of ZS(N) and determine whether ZS(N) acts as a pull-up, pull-down, high-z test line, or nothing at all (shown also in FIG. 8).
3. BRST—Buffered Reset line (shown also in FIG. 5 and in its unbuffered form in FIG. 7).
4. NPOL & PPOL—Negative or Positive Polarity are ignored unless pulse mode is used (shown also in FIG. 7).
5. BPM—Buffered Pulse Mode sets pulse or non-pulse mode (shown also in FIG. 7).
6. CFLD—Clock Function Load is used to determine whether the bit slice in question is a clock pin or a data pin (shown also in FIG. 8).
7. BVCLK—Buffered Vector Clock (shown also in FIG. 9, and elsewhere in its unbuffered form as ICI_CLK1 and ICI_CLK2).
8. BMCLK—Buffered Master Clock (shown also in FIG. 9, and elsewhere in its unbuffered form as MAS_CLK).
9. BDCLK—Buffered Device Clock (shown also in FIG. 9, and elsewhere in its unbuffered form as DEV_CLK).
10. FERR—Force error forces a bus contention error. It is used for diagnostic purposes only (FERR is also shown in FIG. 7).
11. EJTTEN—Enables bus contention error checking (shown also in FIG. 7).
12. BEOEN—Buffered Error Output Enable (shown also in FIG. 8).
13. BTOEN—Buffered timing analyzer option enable (shown also in FIG. 8).
14. BSOEN—Buffered sample output enable (shown also in FIG. 7).
15. BSCLK—Buffered sample clock (shown also in FIG. 9).
16. BDCLKB—Buffered device clock B enabled (shown also in FIG. 9).
17. BIO(N)—(lower right hand corner) connects with the circuit shown in FIG. 7.

The following is an example of the manner in which an individual bit slice 292 of the gate array would be set up to act as a clock driver. The circuit operation is described in detail with reference to FIGS. and 13. In this example, it is assumed that the gate array has been sent all the necessary clock signals defined during the setup procedure. It is also assumed that the optional timing analyzer and memory 34 is not used and that the IC under test desires a clock that operates in pulse mode with positive polarity. Finally, assume that the IC pin is a clock pin and that flip-flop U402 (FIG. 12) has been loaded with logic 1. The timing diagram of FIG. 13 shows the setup condition of the input signals for a clock pin at the bit-slice level.

A. The BRST signal is enabled, thereby causing all internal registers to clear. This in turn causes the IC(N) and ZS(N) terminals 302, 306 to go to high impedance states.

B. The bit slice is set up to be a clock by loading a value of 1 into the D input of flip-flop U402. This is done by putting BSOEN=BTOEN=0, thereby disabling output driver U435. Data line IO(N) 304 is set to a logic 1 state, and CFLD is run one cycle to load the value IO(N)=1 into U402.

C. Since the IC to be evaluated is an edge triggered device, the BPM signal is set to the logic 1 state, which sets up NOR gates U409 and U410 to accept the polarity decision.

D. The Positive or Negative Polarity (NPOL and PPOL) signals are mutually exclusive when enabled, and thus enable either NAND gate U411 or NAND gate U412 to be active.
As shown, BPM=PPOL=logic 0, and NPOL=logic 1. These logic states will enable U412. Loading the logic 1 state into the D input of flip-flop U402 will preset flip-flop U405 which will enable IC(N) output tri-state driver U421 continuously. Thus U402 should be loaded with a logic 1 if the hardware modeling element conductor connected to the IC(N) terminal 302 should be treated as a clock pin. If U402 is loaded with a logic 0 in the D input, then IC(N) will remain at high impedance until new instructions [C(N)=1]are loaded into input C(N) 312.

E. The TSLDA and TSLDB signals are loaded so that flip-flops U400 and U401 are loaded with logic 0 states. This causes ZS(N) terminal 326 to remain in the high-impedance state because a clock pin should not be tested for the high-impedance state.

F. Although not shown on the waveform diagram at this point, the error/bus contention circuit should be enabled if it is to be used. In this example, it is assumed that it is not used, and, therefore, it is not included in the discussion. A description of bus contention error correction is given below.

G. The bit slice gate array circuit 292 is ready to act as a clock driver when it is in the streaming mode. The timing waveforms shown in FIG. 13 depict the following sequence during streaming mode.
  1. C(N) and D(N) become valid, and for this example, D(N) terminal 310 goes to the logic 1 state.
  2. BVCLK is used to latch the data into flip-flops U403 and U404.
  3. BMCLK becomes active and moves the data D(N) 310 to flip-flop U406. If this were an input pin instead of a clock pin, the data D(N) would be moved directly to IC(N) 302, whereas clock pin data has not reached IC(N). This delay allows for setup time of the data before clocks are enabled on the IC under test.
  4. After an appropriate setup time has passed for the data, BDCLK is asserted, allowing the IC(N) terminal 302, corresponding to the clock pin, to be active. The pulse mode NOR gates U409 and U410 go into operation at this point. Recall that PPOL=0, which enables the middle input of NAND gate U412. Immediately after BRST was asserted, flip-flop U415 was reset, placing a logic 0 on the lower input of NAND gate U412. As soon as BDCLK transitions to a logic 1, the data that was on the D input of U415 (which in this case=1) is clocked to its Q output. Simultaneously, BDCLKB transitions to a logic 0. This is because BDCLKB is the logical compliment of BDCLK. At this point the three inputs to U412 are 0, 1, 1 respectively from the top. When BDCLK transitions back to to a logic 0, BDCLKB transitions to a logic 1, thereby setting all three inputs of the NAND gate to a 1. Flip-flop U415 is immediately reset, which forces its Q output to a logic 0. The logic 0 output propagates to the lower input of the NAND gate and removes the reset from the flip-flop. U415 is thus a selectable polarity clock follower circuit that follows BDCLK and provides a simple asynchronous means of providing a pulse on the output of U415 by using only one rising edge, namely that of BDCLK. This process (steps 1–4) is repeated as many times as necessary for the simulation during streaming mode.

H. After each vector is moved to the IC hardware modeling element under evaluation, the streaming control logic waits an appropriate time before latching the resultant output into the sample flip-flop U430.

I. During read mode, BSOEN is enabled, giving a valid output on line IO(N). Thus, the sample taken in step H is read out. If the optional timing anaylzer and memory 34 is used, BTOEN is enabled during the entire experiment, with exception of readout, at which time it is disabled.

The timing waveforms for the other two cases, namely those of the data input and the output, are shown in the timing diagrams of FIGS. 14 and 15. The explanation of the setup, streaming, and readout are very similar to the discussion just given for the clock input.

The above description summarizes the setting up of the gate array for evaluation of an IC device. This is possible by having an internal structure in the gate array that can act as either an input driver, a clock driver, or an output receiver. A bit-slice circuit diagram of the gate array was presented, and an explanation given of the basic setup, streaming and readout modes. Sample timing diagrams and a flowchart are provided for three possible pin types to clarify the procedure.

Special Functions of the Gate Array

The basic functions of the gate array have been discussed, but two other areas of the gate array bit slice are of special importance: high-impedance testing and bus contention corrections.

The first special function is high-impedance (or tri-state) sensing. The hardware modeling circuit can be used to determine whether an output pin of the IC being evaluated is in the high-impedance (Hi-Z) state.

With reference to FIG. 12, the principle of high impedance test operation is that, whenever the data driver U421 is in Hi-Z mode and the device-under-test has a tri-state output capability, the test driver U416 will be able to pull node 302 to both a logic 1 state and a logic 0 state only if the output of the device-under-test is in a high-impedance state.

The simulation is run twice, the test driver driving a logic 0 and logic 1 in sequence. The results are compared, and if the test driver was able to control the IC(N) line 302 in both states, it is known that the pin was in a Hi-Z state.

Figure 16:
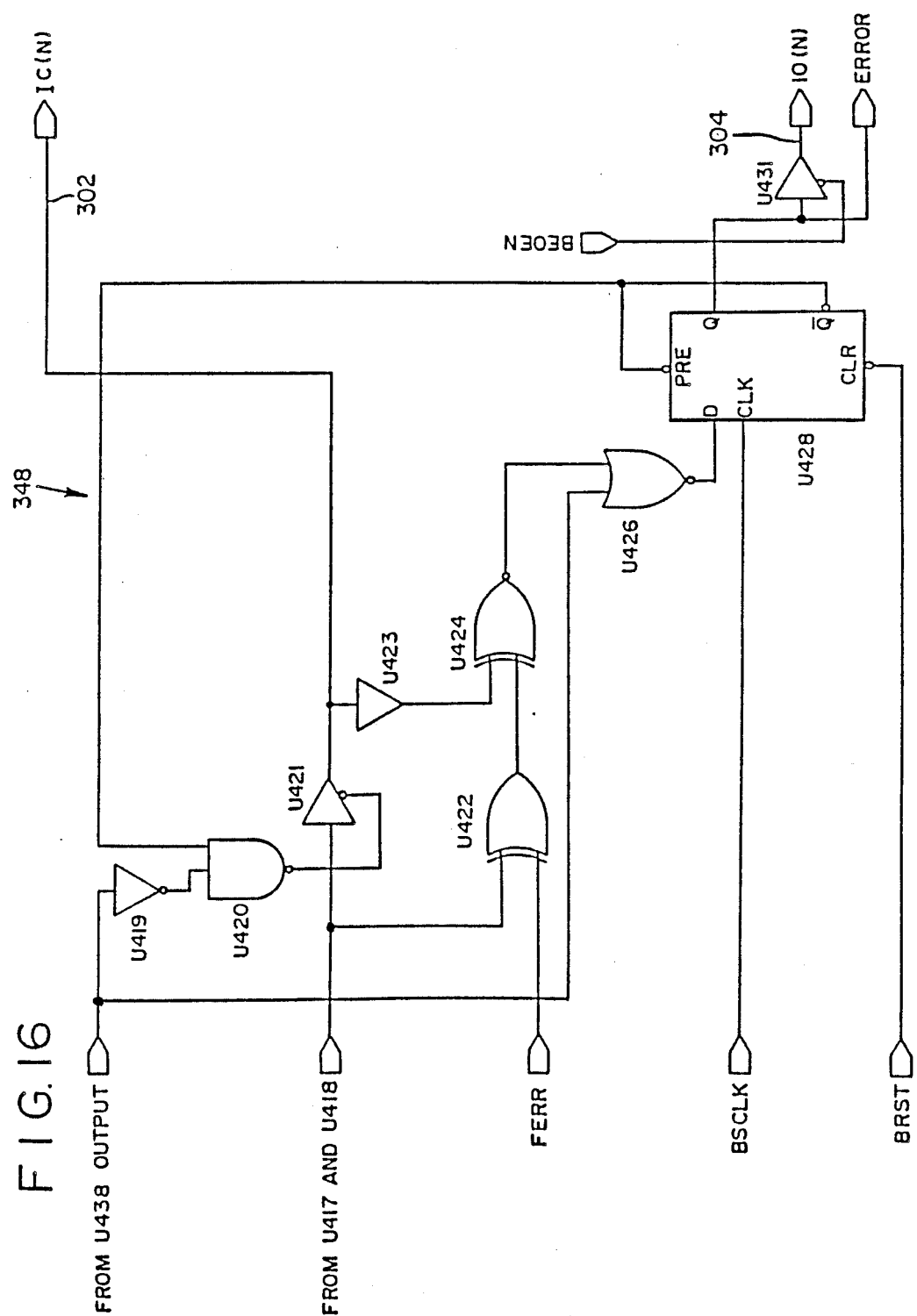
FIG. 16 is an electrical circuit schematic diagram of the bus contention portion of the gate array circuit of FIG. 12.
Figure 17B:
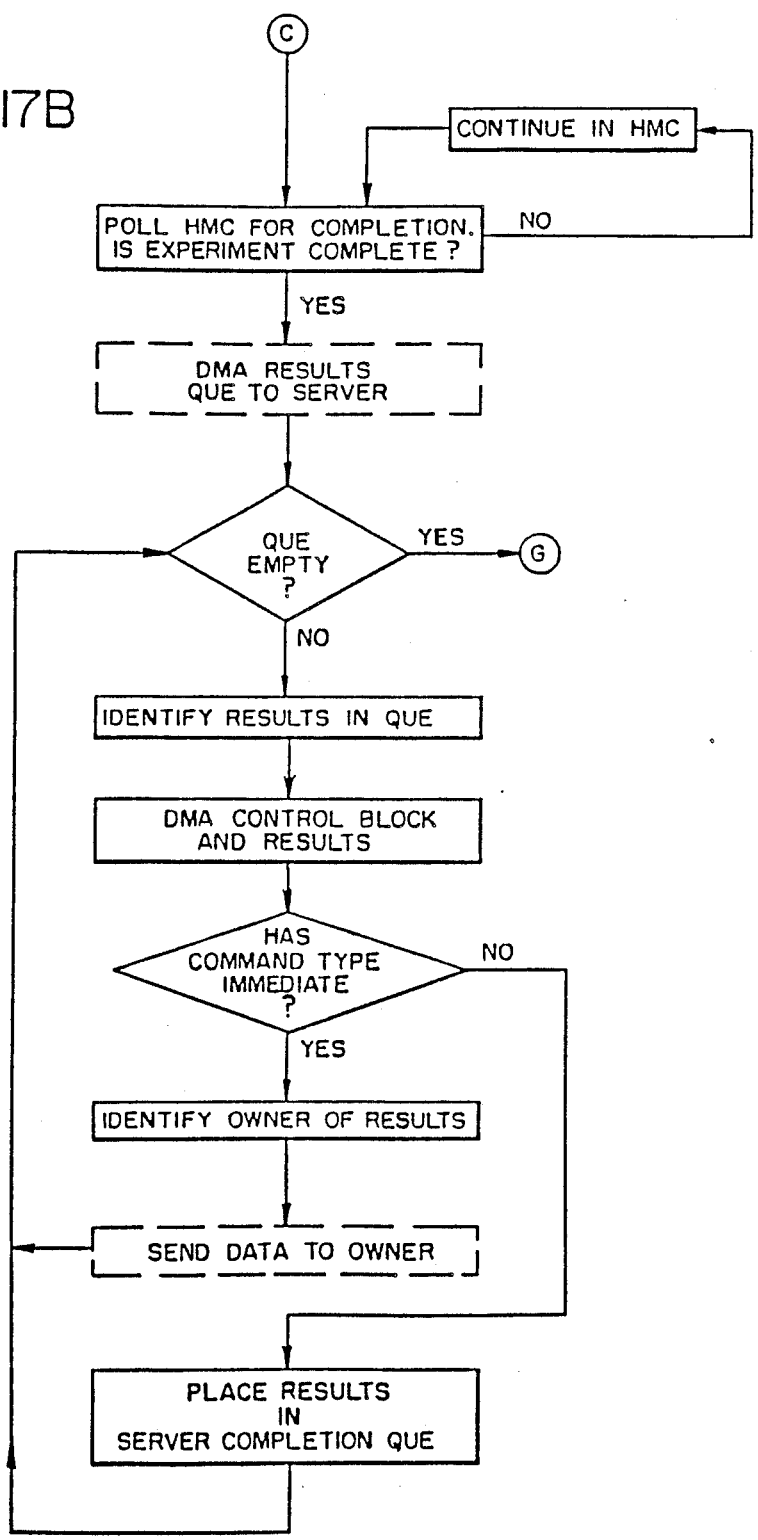
Figure 17C:
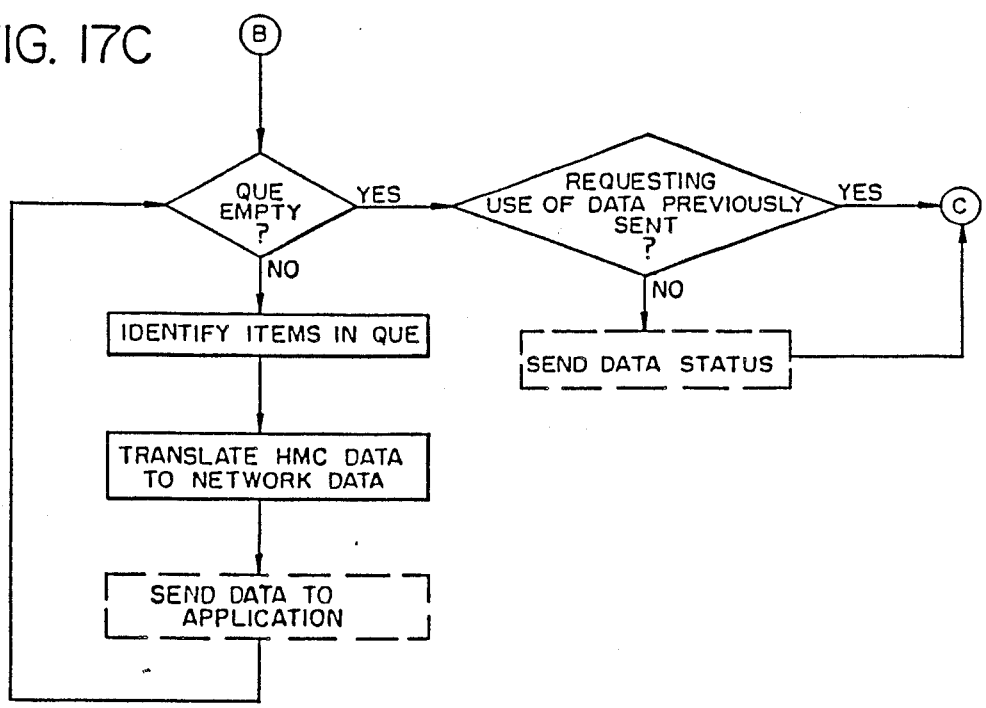
Figure 17D:
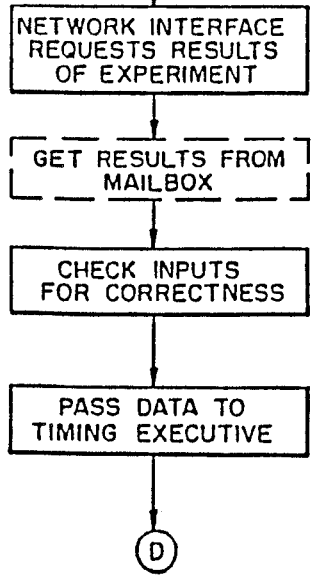
Figure 17E:
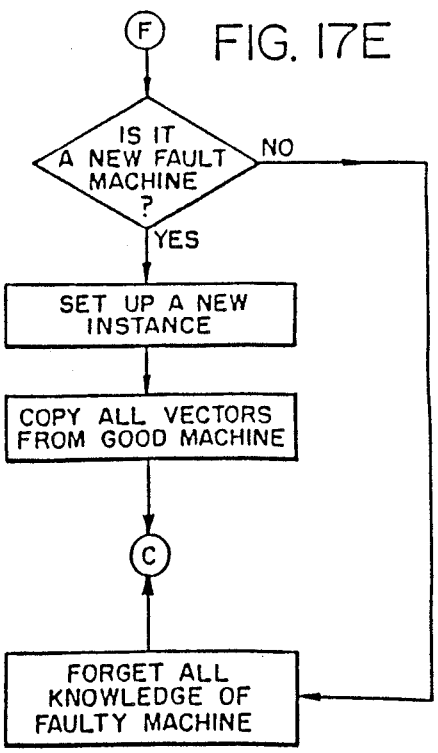

The second gate array special function is used to correct for bus contentions during simulations. With reference to FIG. 16, a potential bus contention occurs when IC(N) 302 is being used as either a clock pin or a data input to the IC being evaluated. If for some reason IC(N) is being driven by both data driver U421 and by the IC itself, a bus contention will occur that could destroy circuitry on either the ICIF gate array or the IC being evaluated. The bus contention problem is resolved as follows.

Whenever the system is started, the BRST signal is enabled to clear flip-flop U428 of bus contention subcircuit 348. Assuming that IC(N) 302 is intended to be either a data driver or a clock driver pin, the signal appearing at the output of inverter U438 is a logic 0. This implies that both inputs of NAND gate U420 will be in logic 1 states, thereby enabling the output driver U421. The output of U421 is applied to the input of U423, which is a Schmitt trigger buffer that cleans up any noise that might be present on the IC(N) line 302. Assuming that the data on the input and output sides of U421 are identical, exclusive-NOR gate U424 will always have a logic 1 at its output. The FERR (forced error test) signal is in the logic 0 state; therefore, the signal appearing at the input of U421 passes unchanged through exclusive-OR U422.

Whenever a bus contention occurs on IC(N), (e.g., the output of IC(N) is being driven with a logic 1 and the IC being evaluated is driving with a logic 0 or vice versa) XNOR gate U424 will provide a logic 0 on its output. After propagation through NOR gate U426, a logic 1 is clocked into flip-flop U428 as soon as BSCLK is applied, and the inverted output of U428 immediately sets flip-flop U428 and disables the NAND gate U420, thereby sending U421 into a tri-state mode. Any further bus hazard is therefore prevented. The error line will show that a bus contention was detected.

The circuit shown in FIG. 16 can be disabled by changing the EJTTEN signal to the logic 1 state, in which case the gate array can be operated without error detection.

Having analyzed a single bit slice of the gate array, one can see that by simply connecting the bit slices together with the appropriate front-end decoding and multiplexing, a complete 16-bit gate array assembly 290 is created. FIGS. 7-10 show the remaining circuitry, including interface logic and the logic common to each of the 16 bit slices, needed to make up the complete gate array. (The lines NC31, NC23, MRLD, XE(N) and XO(N) serve to interconnect the circuitry of FIGS. 7-10.)

Having illustrated and described the principles of our invention with reference to one preferred embodiment, it should be apparent to those persons skilled in the art that such invention may be modified in arrangement and detail without departing from such principles. We claim as our invention all such modifications as come within the true spirit and scope of the following claims.

We claim:

1. In a method of testing proposed electronic circuitry to verify its desired operation, the method comprising the steps:
    implementing said proposed electronic circuitry by a software model that receives input signals and produces output signals corresponding thereto in accordance with the model;
    exercising said modeled circuitry by operating it in conjunction with second circuitry that is to be associated with the proposed circuitry, said second circuitry being actual electronic circuitry, said exercising including stimulating the actual circuitry with signals in accordance with data generated by the software model and sampling an output signal produced by said actual circuitry in response thereto;
    comparing the results produced by the conjunctive operation of said modeled and actual circuitry with desired results to discover errors in operation of the proposed circuitry;
    an improvement comprising:
    permitting an interval between a stimulation of the actual circuitry by the software model and a sampling of the signal produced by said actual circuitry in response thereto, to be controllably varied.

2. In a method of testing proposed electronic circuitry to verify its desired operation, the method comprising the steps:
    implementing said proposed electronic circuitry by a software model that receives input signals and produces output signals corresponding thereto in accordance with the model;
    exercising said modeled circuitry by operating it in conjunction with second circuitry that is to be associated with the proposed circuitry, said second circuitry being actual electronic circuitry, said exercising including stimulating the actual circuitry with signals in accordance with data generated by the software model and sampling an output signal produced by said actual circuitry in response thereto;
    comparing the results produced by the conjunctive operation of said modeled and actual circuitry with desired results to discover errors in operation of the proposed circuitry;
    an improvement comprising:
    permitting a rate at which said actual circuitry is stimulated by the software model to be controllably varied.

3. In a method of testing proposed electronic circuitry to verify its desired operation, the method comprising the steps:
    implementing said proposed electronic circuitry by a software model that receives input signals and produces output signals corresponding thereto in accordance with the model;
    exercising said modeled circuitry by operating it in conjunction with second circuitry that is to be associated with the proposed circuitry, said second circuitry being actual electronic circuitry, said exercising including stimulating the actual circuitry with signals in accordance with data generated by the software model and sampling an output signal produced by said actual circuitry in response thereto;
    comparing the results produced by the conjunctive operation of said modeled and actual circuitry with desired results to discover errors in operation of the proposed circuitry;

an improvement comprising:

presenting a clock signal to said actual circuitry in association with other stimulation signals; and delaying the presentation of said clock signal to said actual circuitry to controllable interval presentation of said other stimulation signals with which said clock signal is associated.

4. In a method of testing proposed electronic circuitry to verify its desired operation, the method comprising the steps:

implementing said proposed electronic circuitry by a software model that receives input signals and produces output signals corresponding thereto in accordance with the model;

exercising said modeled circuitry by operating it in conjunction with second circuitry that is to be associated with the proposed circuitry, said second circuitry being actual electronic circuitry, said exercising including stimulating the actual circuitry with signals at a first rate in accordance with data generated by the software model and sampling an output signal produced by said actual circuitry in response thereto;

comparing the results produced by the conjunctive operation of said modeled and actual circuitry with desired results to discover errors in operation of the proposed circuitry;

an improvement comprising:

sampling at a second rate the output signal produced by said actual circuitry, said second rate being faster than the first rate.

* * * * *

UNITED STATES PATENT AND TRADEMARK OFFICE
CERTIFICATE OF CORRECTION

PATENT NO. : 4,937,827

DATED : June 26, 1990

INVENTOR(S) : Ronald R. Beck et al.

It is certified that error appears in the above-identified patent and that said Letters Patent is hereby corrected as shown below:

Column 27, line 4, "FIGS. and 13" should be --FIGS. 12 and 13--;

Column 31, line 7, "circuitry to controllable" should be --circuitry a controllable--;

Column 31, line 8, "interval presentation" should be --interval after presentation--.

Signed and Sealed this

First Day of September, 1992

Attest:

DOUGLAS B. COMER

Attesting Officer

Acting Commissioner of Patents and Trademarks